(12) United States Patent
Lin et al.

(10) Patent No.: US 11,676,916 B2
(45) Date of Patent: Jun. 13, 2023

(54) STRUCTURE AND FORMATION METHOD OF PACKAGE WITH WARPAGE-CONTROL ELEMENT

(71) Applicant: Taiwan Semiconductor Manufacturing Company, Ltd., Hsinchu (TW)

(72) Inventors: Yu-Sheng Lin, Zhubei (TW); Chien-Hung Chen, Taipei (TW); Po-Chen Lai, Hsinchu County (TW); Po-Yao Lin, Zhudong Township, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/461,567

(22) Filed: Aug. 30, 2021

(65) Prior Publication Data
US 2023/0062783 A1    Mar. 2, 2023

(51) Int. Cl.
*H01L 23/50* (2006.01)
*H01L 23/00* (2006.01)
*H01L 25/00* (2006.01)
*H01L 25/18* (2023.01)

(52) U.S. Cl.
CPC ............ *H01L 23/562* (2013.01); *H01L 25/18* (2013.01); *H01L 25/50* (2013.01)

(58) Field of Classification Search
None
See application file for complete search history.

(56) References Cited

U.S. PATENT DOCUMENTS

| 7,144,756 B1 * | 12/2006 | Wang | H01L 23/055 |
| | | | 257/E23.101 |
| 7,250,329 B2 * | 7/2007 | Yamano | H01L 21/4846 |
| | | | 438/109 |
| 7,253,021 B2 * | 8/2007 | Nishi | B29C 45/02 |
| | | | 438/69 |
| 7,319,051 B2 * | 1/2008 | Cheah | H01L 21/54 |
| | | | 257/E23.092 |
| 8,993,380 B2 | 3/2015 | Hou et al. | |
| 9,000,584 B2 | 4/2015 | Lin et al. | |
| 9,029,989 B2 * | 5/2015 | Park | H01L 23/552 |
| | | | 257/629 |
| 9,048,222 B2 | 6/2015 | Hung et al. | |

(Continued)

FOREIGN PATENT DOCUMENTS

| CN | 114975138 A | * | 8/2022 | ......... H01L 21/4817 |
| TW | 200941870 A1 | | 10/2009 | |

(Continued)

*Primary Examiner* — Michael Lebentritt
(74) *Attorney, Agent, or Firm* — Birch, Stewart, Kolasch & Birch, LLP

(57) ABSTRACT

A package structure and a formation method of a package structure are provided. The package structure includes a circuit substrate and a die package bonded to the circuit substrate through bonding structures. The package structure also includes a warpage-control element attached to the circuit substrate. The warpage-control element has a protruding portion extending into the circuit substrate. The warpage-control element has height larger than that of the die package.

20 Claims, 23 Drawing Sheets

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,935,082 B2 * | 4/2018 | Watanabe | H01L 21/565 |
| 9,941,180 B2 * | 4/2018 | Kim | H01L 23/562 |

FOREIGN PATENT DOCUMENTS

| | | | | |
|---|---|---|---|---|
| TW | 201838080 A | | 10/2018 | |
| TW | 202009980 A | * | 3/2020 | G03F 7/2022 |
| TW | 202115839 A | | 4/2021 | |

* cited by examiner

STRUCTURE AND FORMATION METHOD OF PACKAGE WITH WARPAGE-CONTROL ELEMENT

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
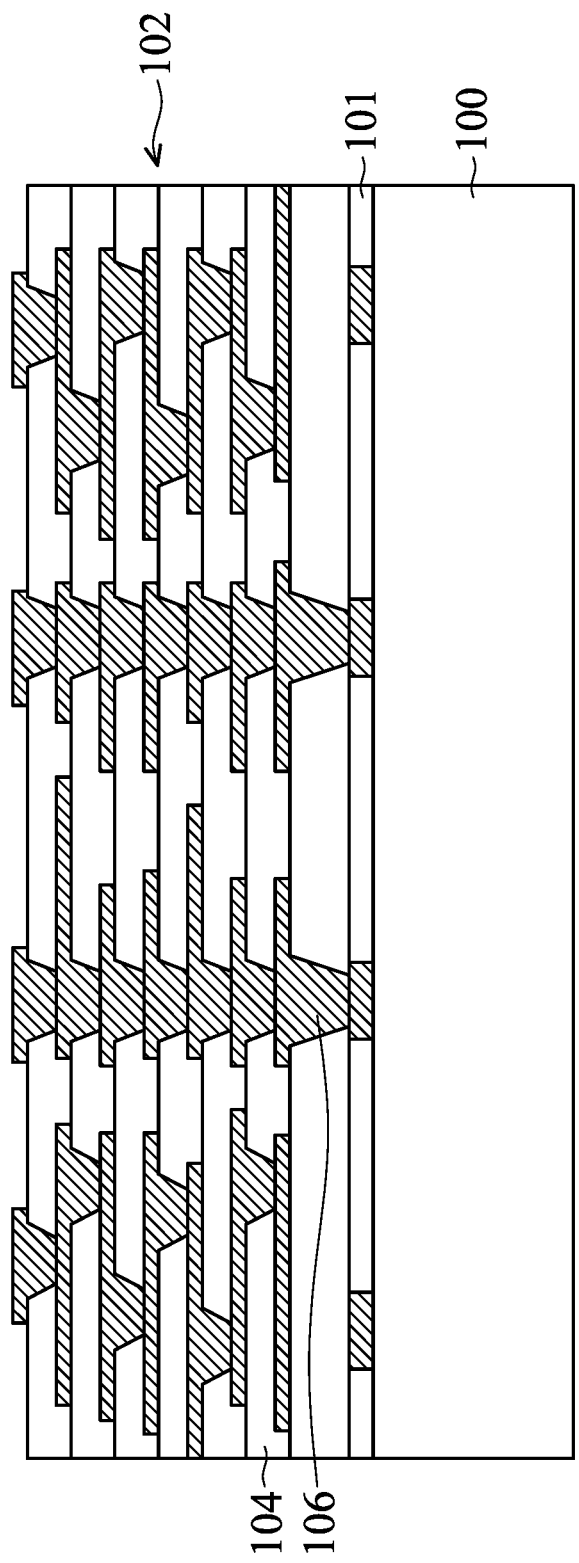
FIGS. 1A-1F are cross-sectional views of various stages of a process for forming a portion of a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher of what is specified, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10 degrees. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure and/or the package structure. Some of the features described below can be replaced or eliminated for different embodiments. Although some embodiments are discussed with operations performed in a particular order, these operations may be performed in another logical order.

Embodiments of the disclosure may relate to package structures such as three-dimensional (3D) packaging or 3D-IC devices. Embodiments of the disclosure form a package structure including a circuit substrate that carries one or more dies or packages and a warpage-control element aside the dies or packages. The warpage-control element, such as a ring, has one or more step portions on its bottom. The step portion may be protruding portion extending into the circuit substrate to improve the surface mount connection of the formed package.

FIGS. 1A-1F are cross-sectional views of various stages of a process for forming a package structure, in accordance with some embodiments. As shown in FIG. 1A, a carrier substrate 100 is provided or received. The carrier substrate 100 is used as a support substrate during the fabrication process. In some embodiments, the carrier substrate 100 is a temporary support carrier and will be removed later.

The carrier substrate 100 may be made of or include a dielectric material, a semiconductor material, one or more other suitable materials, or a combination thereof. In some embodiments, the carrier substrate 100 is a dielectric substrate, such as a glass wafer. In some other embodiments, the carrier substrate 100 is a semiconductor substrate, such as a silicon wafer. The semiconductor substrate may be made of or include silicon, germanium, silicon germanium, one or more other suitable semiconductor materials, or a combination thereof.

As shown in FIG. 1A, a redistribution structure 102 is formed over the carrier substrate 100, in accordance with some embodiments. The redistribution structure 102 may include a release film 101, multiple insulating layers 104, and multiple conductive features 106. The release film 101 and the carrier substrate 100 may together be removed later.

In some embodiments, the insulating layers 104 are polymer-containing layers. The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104. These openings may be used to contain some of the conductive features 106.

The conductive features 106 may include conductive lines, conductive vias, and/or conductive pads. The conductive features 106 may be made of or include copper, cobalt, tin, titanium, gold, platinum, aluminum, tungsten, one or more other suitable materials, or a combination thereof. The conductive features 106 may be formed using an electroplating process, an electroless plating process, one or more other applicable processes, or a combination thereof. The formation of the conductive features 106 may further involve one or more etching processes.

As shown in FIG. 1A, some of the conductive features 106 in the redistribution structure 102 are conductive vias. In some embodiments, the upper portion of the conductive via is wider than the lower portion of the conductive via, as shown in FIG. 1A.

Figure 1B:
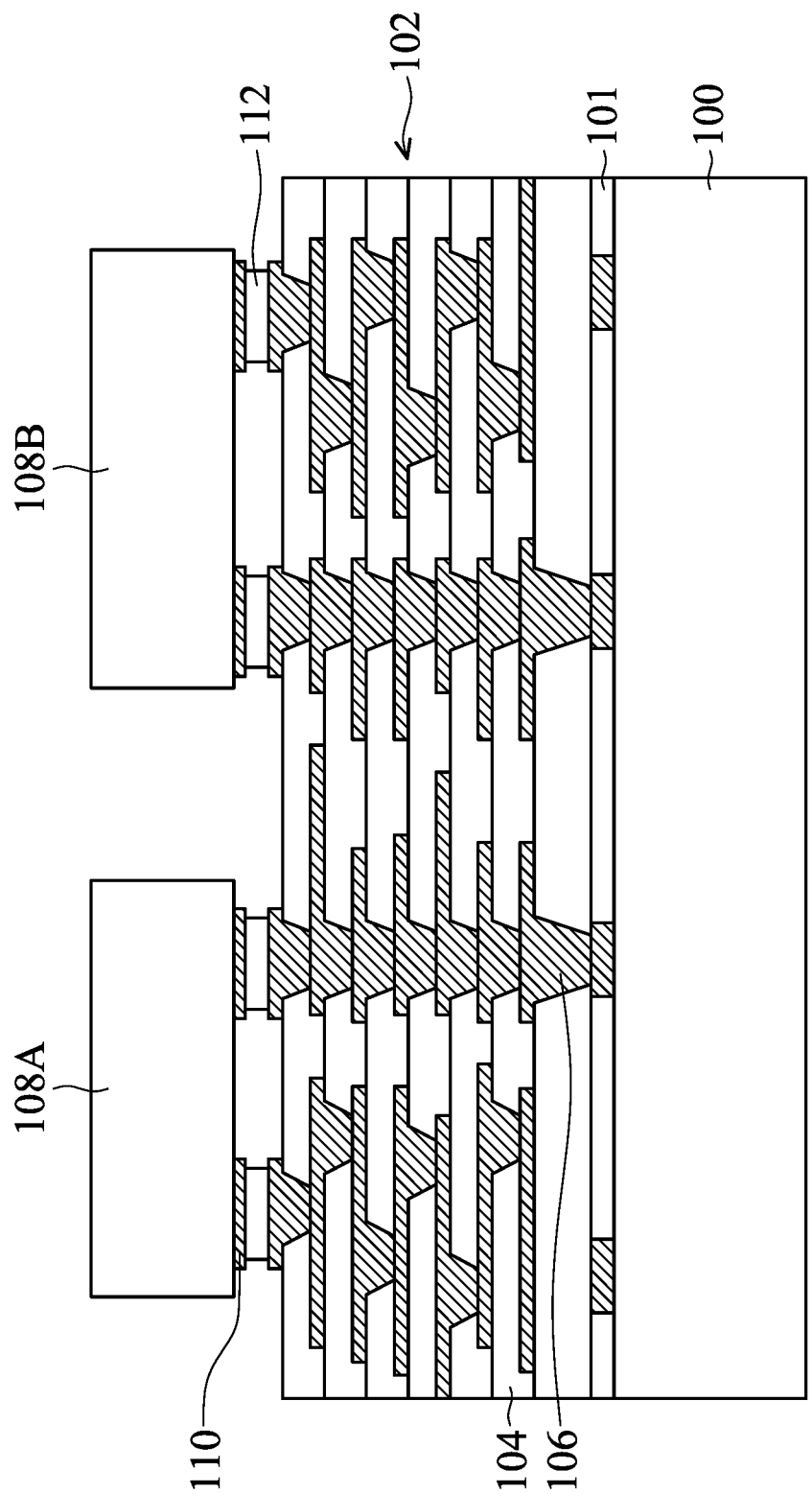

As shown in FIG. 1B, multiple chip structures (or chip-containing structures) 108A and 108B are disposed over the redistribution structure 102, in accordance with some embodiments. In some embodiments, before the chip structures 108A and 108B are disposed, a testing operation is performed to the redistribution structure 102 to ensure the quality and reliability of the redistribution structure 102.

In some embodiments, the chip structures 108A and 108B are bonded onto the conductive pads of the redistribution structure 102 through conductive connectors 112. In some embodiments, each of the chip structures 108A and 108B includes conductive pillars (or conductive pads) 110 with solder elements formed thereon. Solder elements may also be formed on the conductive pads of the redistribution structure 102. The chip structures 108A and 108B are picked and placed onto the redistribution structure 102. In some embodiments, the solder elements of the chip structures 108A and 108B and/or the solder elements on the conductive pads of the redistribution structure 102 are reflowed together. As a result, the reflowed solder elements form the conductive connectors 112.

Each of the chip structures 108A and 108B may be a single semiconductor die, system-on-integrated-chips (SoIC), and/or a package including one or more semiconductor dies that are encapsulated or protected. For the system-on-integrated-chips, multiple semiconductor dies may be stacked and bonded together to form electrical connections between these semiconductor dies. In some embodiments, the semiconductor dies are system-on-chip (SoC) chips that include multiple functions. In some embodiments, the back sides of the semiconductor dies face upwards with the front sides of the semiconductor dies facing the redistribution structure 102. In some embodiments, some of the semiconductor dies include memory devices such as high bandwidth memory (HBM) devices. In some embodiments, the chip structures 108A and 108B are semiconductor dies such as SoC dies. In some embodiments, each of the chip structures 108A and 108B is system-on-integrated-chips (SoIC) that includes multiple semiconductor dies that are stacked together. In some other embodiments, the chip structures 108A and 108B are packages that include one or more semiconductor dies therein. In some other embodiments, the chip structure 108A is an SoIC die, and the chip structure 108B includes memory devices.

Figure 1C:
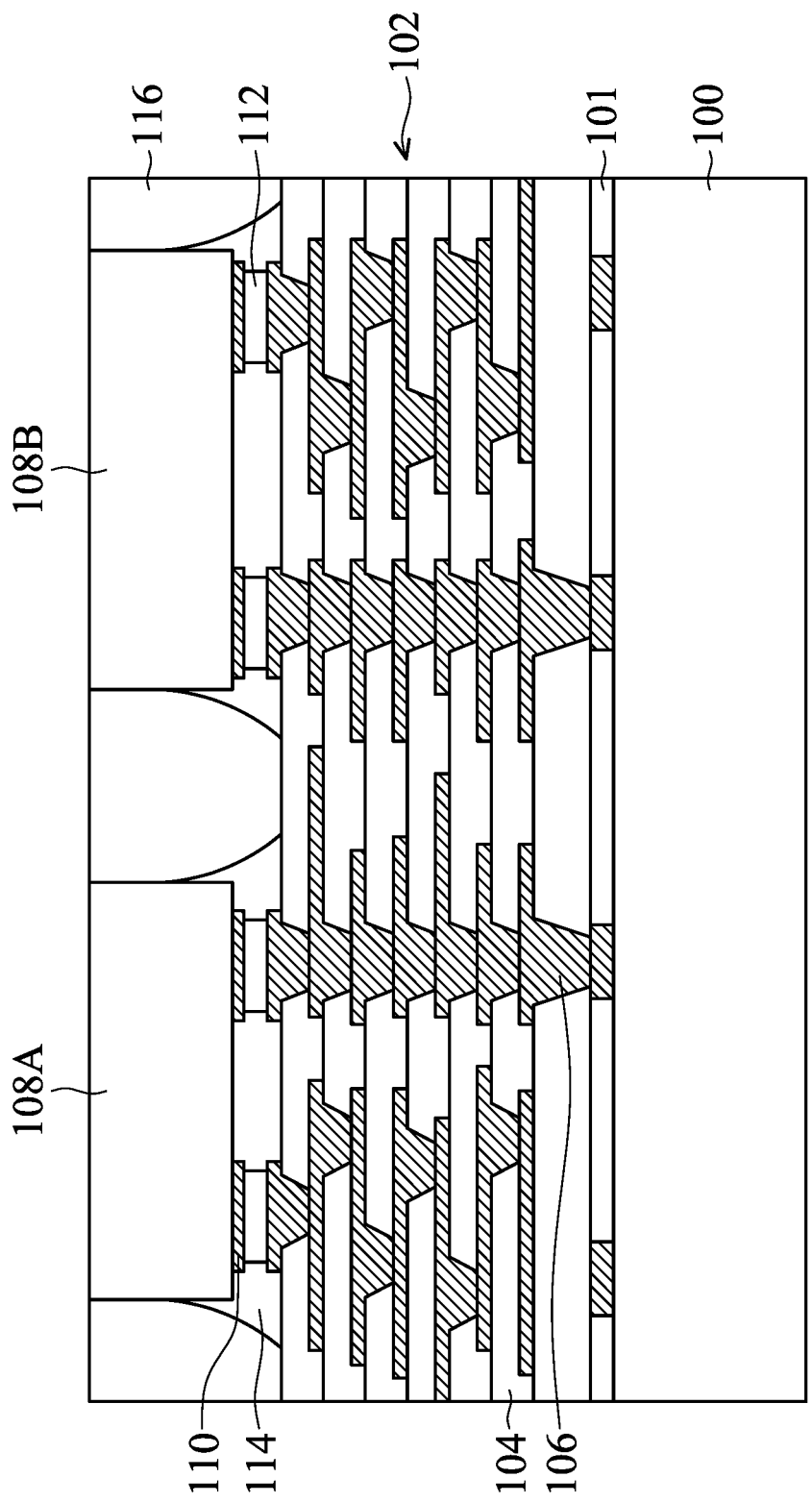

As shown in FIG. 1C, an underfill material 114 is formed to surround and protect the conductive connectors 112, in accordance with some embodiments. The underfill material 114 may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof.

Afterwards, a protective layer 116 is formed over the redistribution structure 102 to surround and protect the chip structures 108A and 108B, as shown in FIG. 1C in accordance with some embodiments. In some embodiments, the protective layer 116 is in direct contact with the redistribution structure 102. In some embodiments, the protective layer 116 is separated from the conductive connectors 112 below the chip structures 108A and 108B by the underfill material 114.

However, embodiments of the disclosure are not limited thereto. Many variations and/or modifications can be made to embodiments of the disclosure. In some other embodiments, the underfill material 114 is not formed. In these cases, the protective layer 116 may be in direct contact with the conductive connectors 112 below the chip structures 108A and 108B.

In some embodiments, the protective layer 116 is made of or includes an insulating material such as a molding material. The molding material may include a polymer material, such as an epoxy-based resin with fillers dispersed therein. The fillers may include fibers (such as silica fibers and/or carbon-containing fibers), particles (such as silica particles and/or carbon-containing particles), or a combination thereof. In some embodiments, the distribution density of the fillers in the protective layer 116 is greater than the distribution density of the fillers in the underfill material 114. In some embodiments, the weight percentage of the fillers in the protective layer 116 is greater than the weight percentage of the fillers in the underfill material 114. The profiles, sizes, and/or materials of the fillers in the protective layer 116 and the underfill material 114 may be different from each other.

In some embodiments, a molding material (such as a liquid molding material) is introduced or injected to cover the redistribution structure 102 and the chip structures 108A and 108B. In some embodiments, a thermal process is then used to cure the liquid molding material and to transform it into the protective layer 116. In some embodiments, a planarization process is performed to the protective layer 116 to improve the flatness of the protective layer 116. For example, the planarization process may include a grinding process, a CMP process, a dry polishing process, one or more other applicable processes, or a combination thereof. In some embodiments, after the planarization process, the surfaces of the chip structures 108A and 108B are exposed. In some embodiments, the top surface of the protective layer 116 is substantially level with the surfaces of the chip structures 108A and 108B.

Figure 1D:
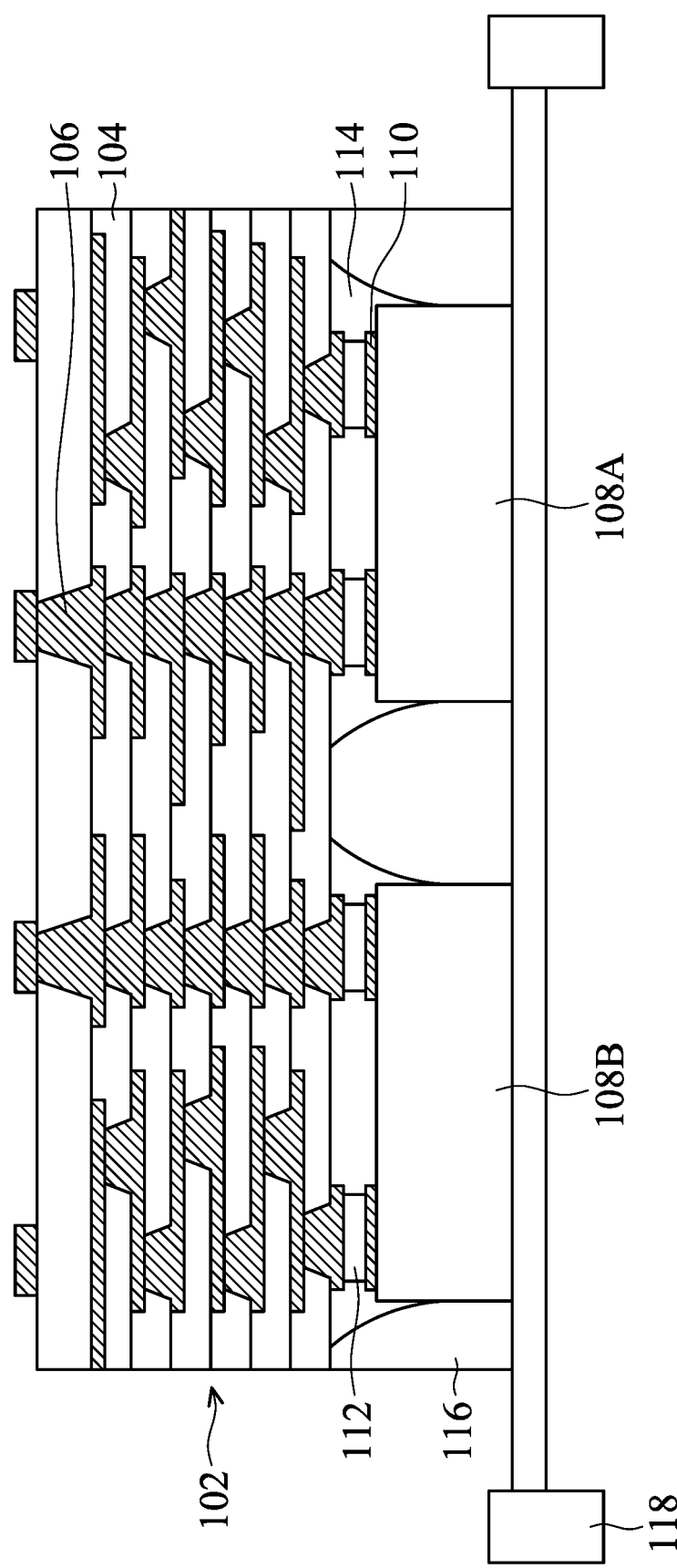

Afterwards, the structure shown in FIG. 1C is flipped upside down and attached onto a carrier tape 118, in accordance with some embodiments. Afterwards, the carrier substrate 100 and the release film 101 are removed, as shown in FIG. 1D in accordance with some embodiments. As a result, the surface of the redistribution structure 102 that is originally covered by the carrier substrate 100 is exposed.

Figure 1E:
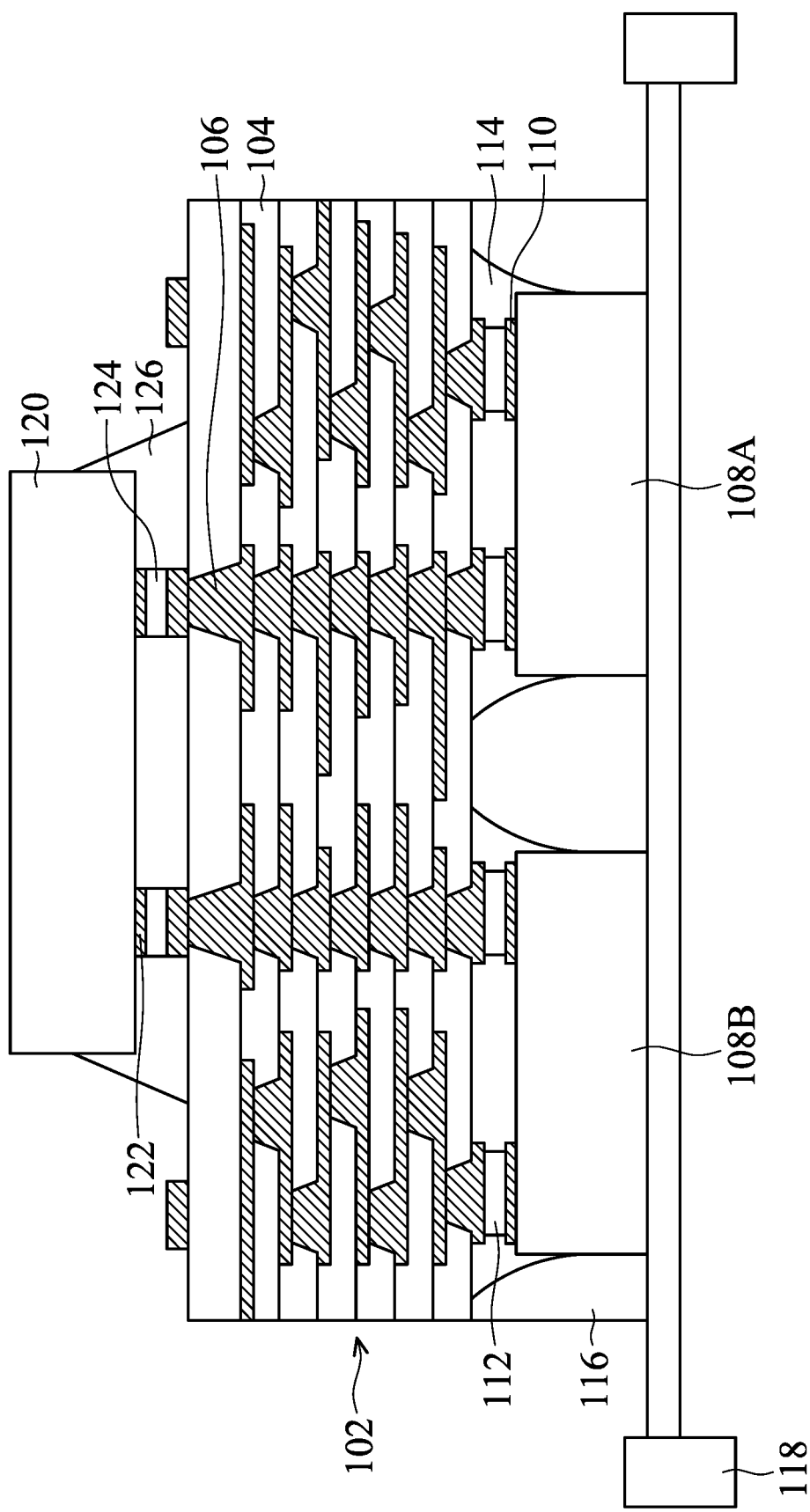

As shown in FIG. 1E, one or more chip structures (or chip-containing structures) 120 are bonded to the redistribution structure 102 through conductive connectors 124, in accordance with some embodiments. The material and formation method of the conductive connectors 124 may be the same as or similar to those of the conductive connectors 112. Through the conductive connectors 124, electrical connections are formed between the conductive pillars (or conductive pads) 122 of the chip structure 120 and some of the conductive features 106 of the redistribution structure 102. In some embodiments, the chip structure 120 forms electrical connections between the chip structures 108A and 108B through some of the conductive features 106 of the redistribution structure 102, as shown in FIG. 1E.

The chip structure 120 may be a single semiconductor die, system-on-integrated-chips (SoIC), and/or a package including one or more semiconductor dies that are encapsulated or protected. For the system-on-integrated-chips, multiple semiconductor dies are stacked and bonded together to form electrical connections between these semiconductor dies. In some embodiments, the semiconductor dies are system-on-chip (SoC) chips that include multiple functions. In some embodiments, some of the semiconductor dies include memory devices such as high bandwidth memory (HBM) devices. In some embodiments, the chip structure 120 is an interconnection die that receive and/or transfer electrical signals to and/or from the chip structures 108A and 108B. In some embodiments, the chip structure 120 has no active devices formed therein. In some other embodiments, the chip structure 120 includes active devices and passive devices formed therein. In some other embodiments, a surface mounted device is used to replace the chip structure 120. The surface mounted device may include, for example, resistors, capacitors, insulators, one or more other suitable devices, or a combination thereof.

As shown in FIG. 1E, an underfill material 126 is formed over the redistribution structure 102 to surround the conductive connectors 124, in accordance with some embodiments. The material and formation method of the underfill material 126 may be the same as or similar to those of the underfill material 114. Many variations and/or modifications can be made to embodiments of the disclosure. In some other embodiments, the underfill material 126 is not formed. In some other embodiments, the chip structure 120 is not formed.

Figure 1F:
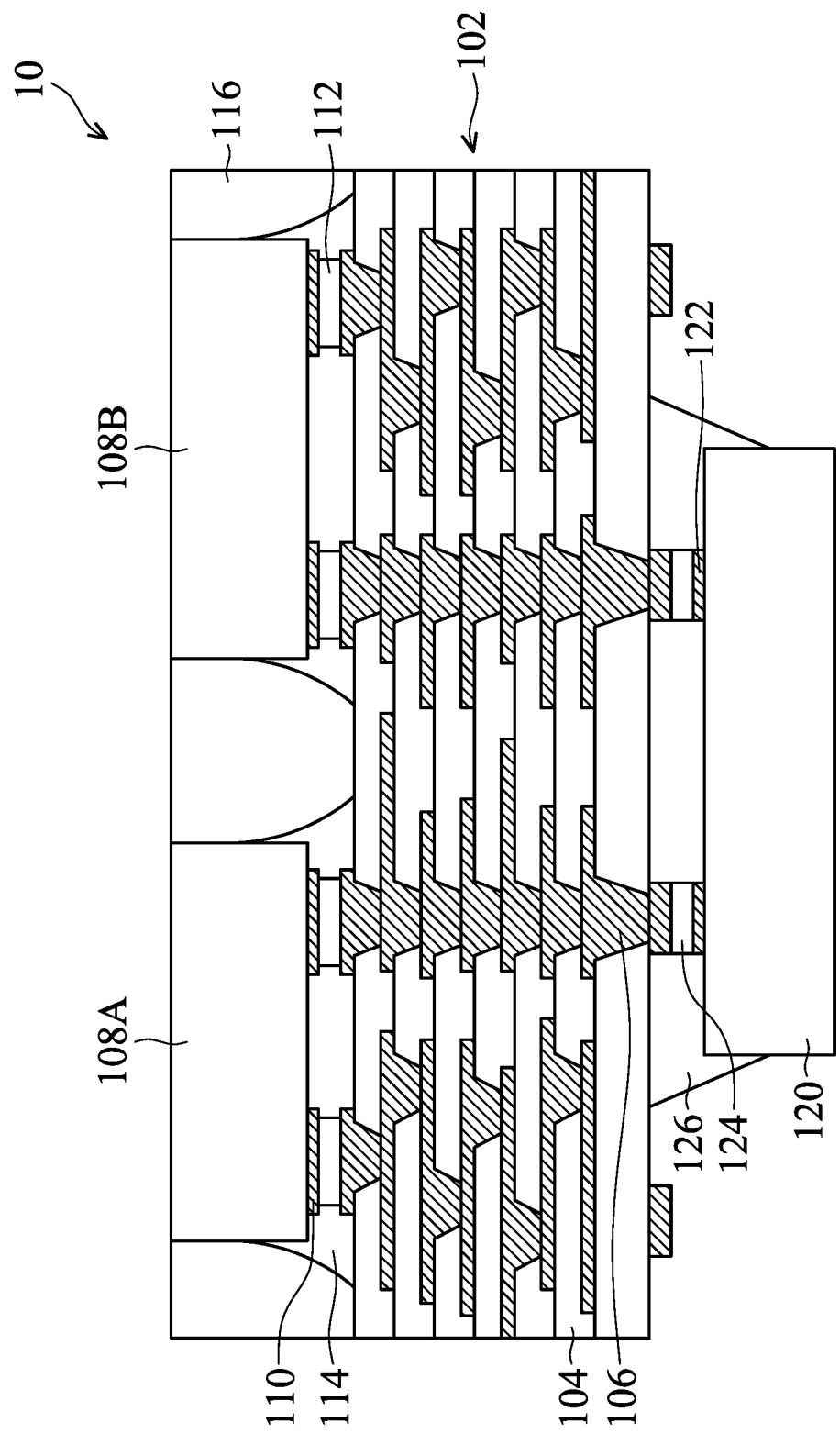

In some embodiments, a sawing process is used to cut through the structure shown in FIG. 1E into multiple separate die packages. After the sawing process, one die package 10 is picked from the carrier tape 118 and turned upside down, as shown in FIG. 1F in accordance with some embodiments. The die package 10 is to be integrated with other elements to form a larger package structure.

However, embodiments of the disclosure are not limited thereto. Many variations and/or modifications can be made to embodiments of the disclosure. In some other embodiments, the sawing process is not performed to separate the structure in FIG. 1E into multiple smaller die packages. The entirety of the package structure may directly be integrated into a large package structure without being sawed.

Figure 2A:
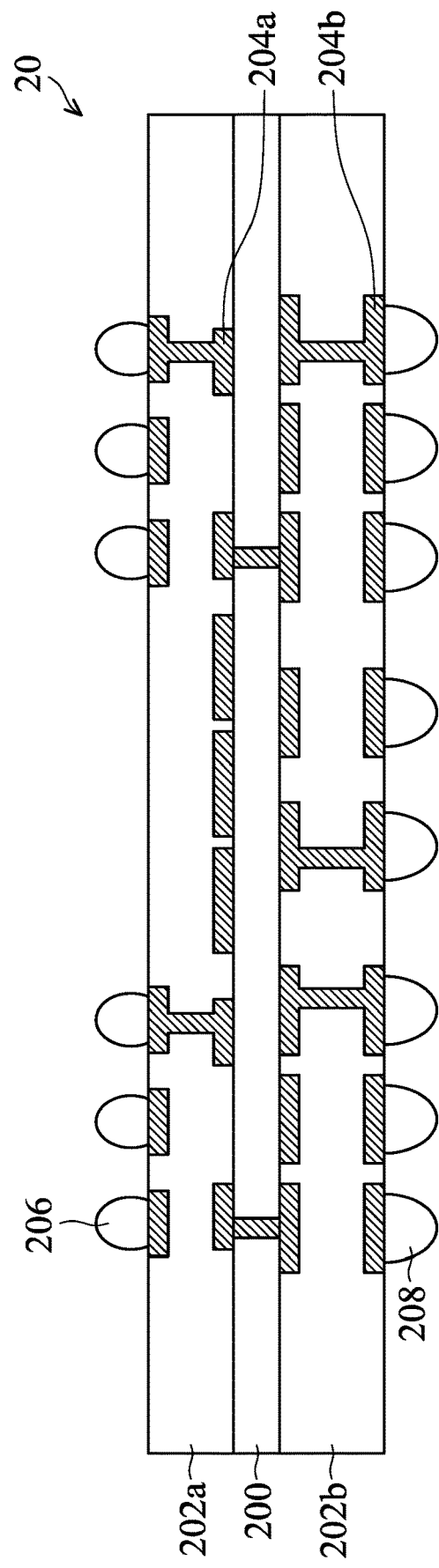
FIGS. 2A-2E are cross-sectional views of various stages of a process for forming a portion of a package structure, in accordance with some embodiments.

FIGS. 2A-2E are cross-sectional views of various stages of a process for forming a portion of a package structure, in accordance with some embodiments. As shown in FIG. 2A, a circuit substrate (or a package substrate) 20 is received or provided. In some embodiments, the circuit substrate 20 includes a core portion 200. The circuit substrate 20 may further includes multiple insulating layers 202a and 202b and multiple conductive features 204a and 204b. The conductive features 204a and 204b may be used to route electrical signals between opposite sides of the circuit substrate 20. The insulating layers 202a and 202b may be made of or include one or more polymer materials. The conductive features 204a and 204b may be made of or include copper, aluminum, cobalt, tungsten, gold, one or more other suitable materials, or a combination thereof.

The core portion 200 may include organic materials such as materials that can be easily laminated. In some embodiments, the core portion 200 may include a single-sided or double-sided copper clad laminate, epoxy, resin, glass fiber, molding compound, plastic (such as polyvinylchloride (PVC), acrylonitril, butadiene and styrene (ABS), polypropylene (PP), polyethylene (PE), polystyrene (PS), polymethyl methacrylate (PMMA), polyethylene terephthalate (PET), polycarbonates (PC), polyphenylene sulfide (PPS)), one or more other suitable elements, or a combination thereof. Conductive vias may extend through the core portion 200 to provide electrical connections between elements disposed on either side of the core portion 200. In some embodiments, the circuit substrate 20 further includes bonding structures 206 and 208. In some embodiments, the bonding structures 206 and 208 are solder bumps. In some embodiments, the bonding structures 208 are used for bonding with another element such as a printed circuit board.

In some embodiments, the circuit substrate 20 has multiple predetermined regions where no conductive feature is formed. The predetermined region may be partially removed to form one or more recesses later. The recesses may be used to contain other device elements (such as semiconductor dies) and/or other elements (such as protruding portions of a warpage-control element that will be formed later).

Figure 2B:
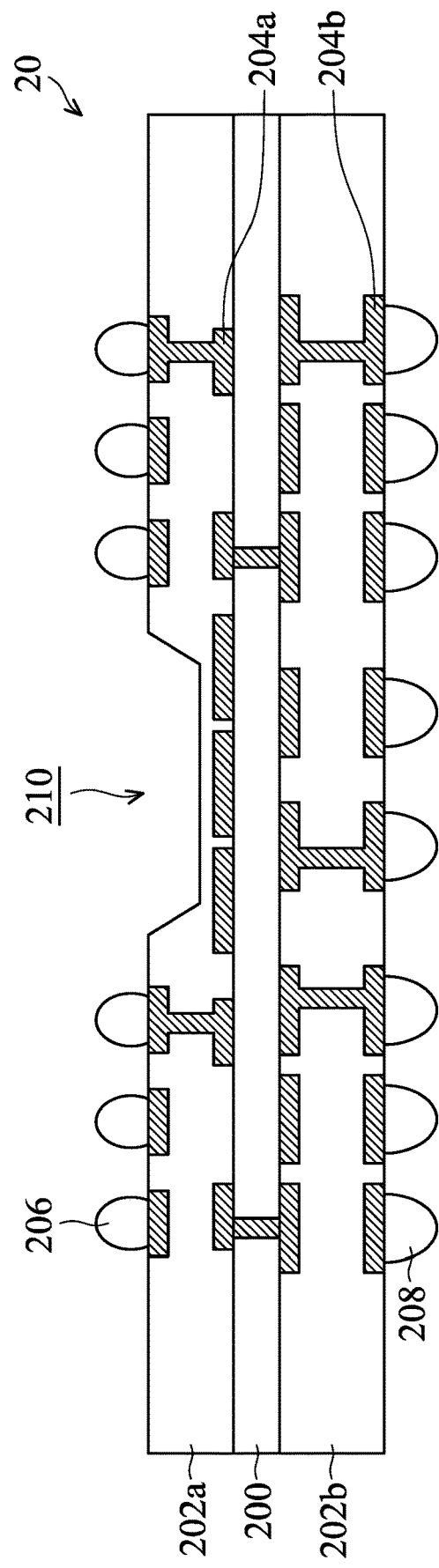

As shown in FIG. 2B, one of the predetermined regions of the circuit substrate 20 is partially removed to form a recess 210, in accordance with some embodiments. After the partial removal of the circuit substrate 20, interior sidewalls of the circuit substrate 20 are formed. The interior sidewalls of the circuit substrate 20 define the sidewalls of the recess 210, as shown in FIG. 2B.

In some embodiments, the recess 210 is formed using an energy beam drilling process. The energy beam drilling process may include a laser beam drilling process, an ion beam drilling process, an electron beam drilling process, one or more other applicable processes, or a combination thereof. The energy beam drilling process may be performed multiple times to different regions of the circuit substrate 20. As a result, the recess 210 with the designed profile is formed. In some other embodiments, the recess 210 is formed using a mechanical drilling process. For example, a computer numerical control (CNC) engraving machine may be used to form the recess 210. In some other embodiments, one or more photolithography processes and one or more etching processes are used to partially remove the circuit substrate 20, so as to form the recess 210. In some other embodiments, the circuit substrate 20 is partially removed using an energy beam drilling process, a mechanical drilling process, an etching process, one or more other applicable processes, or a combination thereof.

Figure 2C:
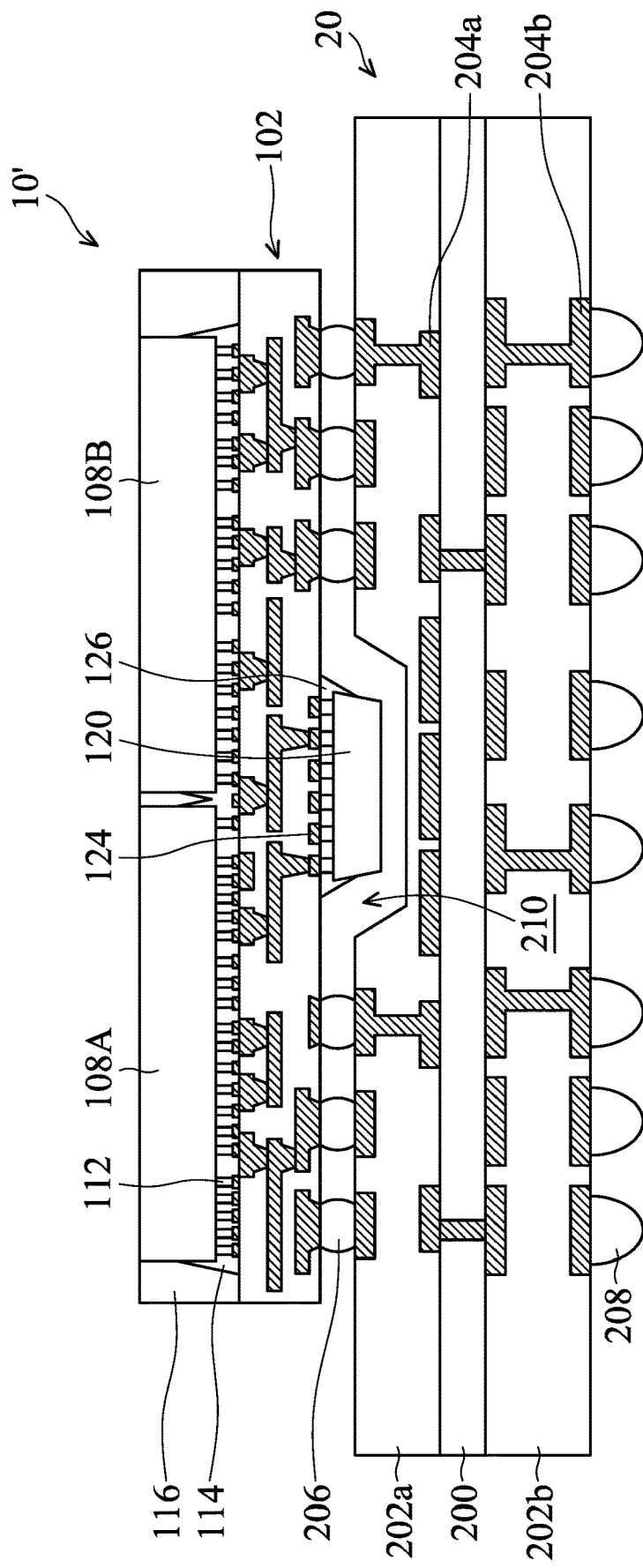

As shown in FIG. 2C, a die package 10' that is the same as or similar to the die package 10 shown in FIG. 1F is received or provided. In some embodiments, the die package 10' is picked and placed over the circuit substrate 20. Afterwards, the die package 10' is bonded to the circuit substrate 20 through the bonding structures 206.

In some embodiments, the die package 10' is disposed over the circuit substrate 20 such that the conductive pads of the redistribution structure 102 are in direct contact with the bonding structures 206. In some other embodiments, additional solder elements may be formed on the conductive pads of the redistribution structure 102 before the die package 10' is disposed over the circuit substrate 20. Afterwards, a thermal reflow process and/or a thermal compression process are used to bond the die package 10' to the circuit substrate 20. As a result, a component (such as the chip structure 120) of the die package 10' enters the recess 210, as shown in FIG. 2C. The recess 210 provides a space for partially containing the component of the die package 10'. The total height of the package structure may thus be reduced further. In some other embodiments, the component of the die package entering the recess 210 is a surface mounted device that includes, for example, resistors, capacitors, insulators, one or more other suitable devices, or a combination thereof.

Afterwards, an underfill liquid is dispensed onto the circuit substrate 20 along a side of the die package 10', in accordance with some embodiments. The underfill liquid may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof. The underfill liquid may be drawn into the space between the die package 10' and the circuit substrate 20 to surround some of the bonding structures 206 by the capillary force.

Figure 2D:
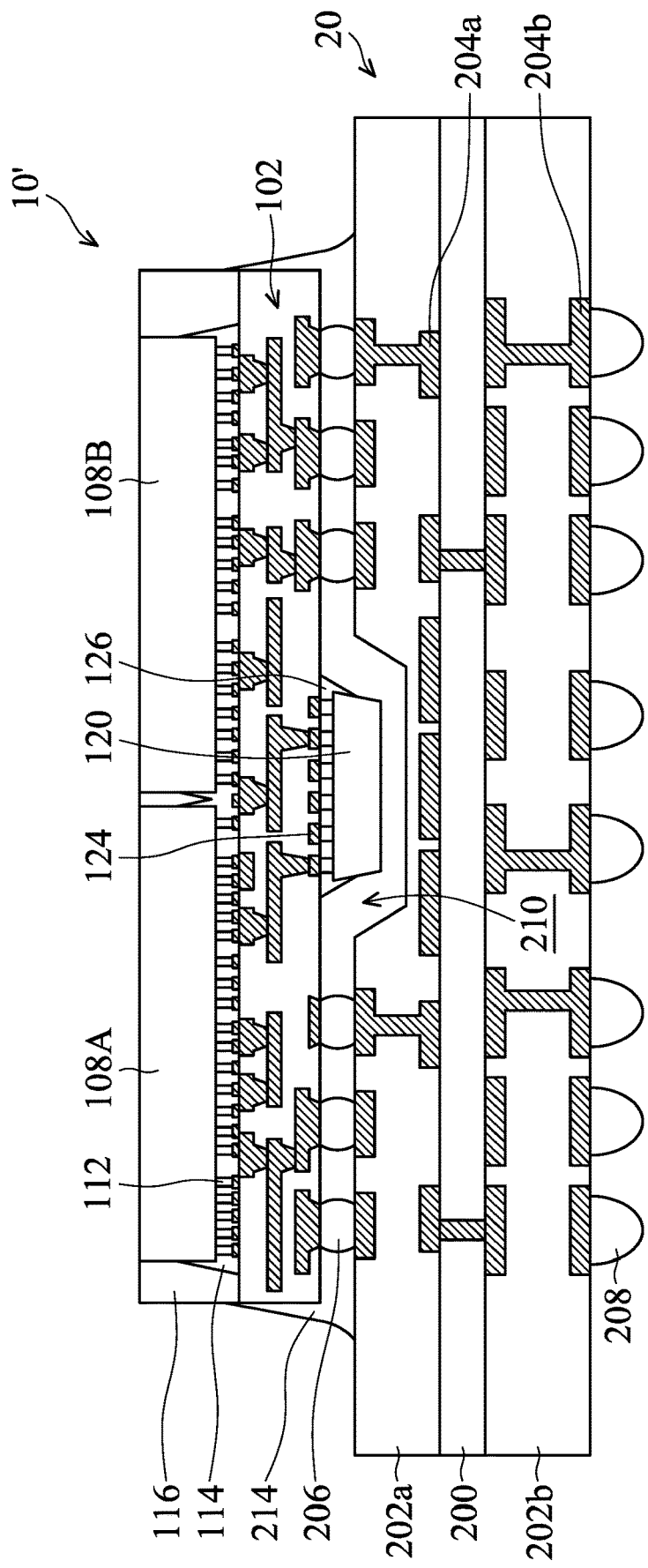

Afterwards, the underfill liquid is further drawn into the recess 210 and reaching another side of the die package 10' by the capillary force, in accordance with some embodiments. In some embodiments, the underfill liquid is thermally heated and cured to form an underfill material 214. As a result, the underfill material 214 that surrounds the bonding structures 206 and fills the recess 210 is formed, as shown in FIG. 2D. In some embodiments, the underfill material 214 is in direct contact with the interior sidewalls of the circuit substrate 20.

Figure 2E:
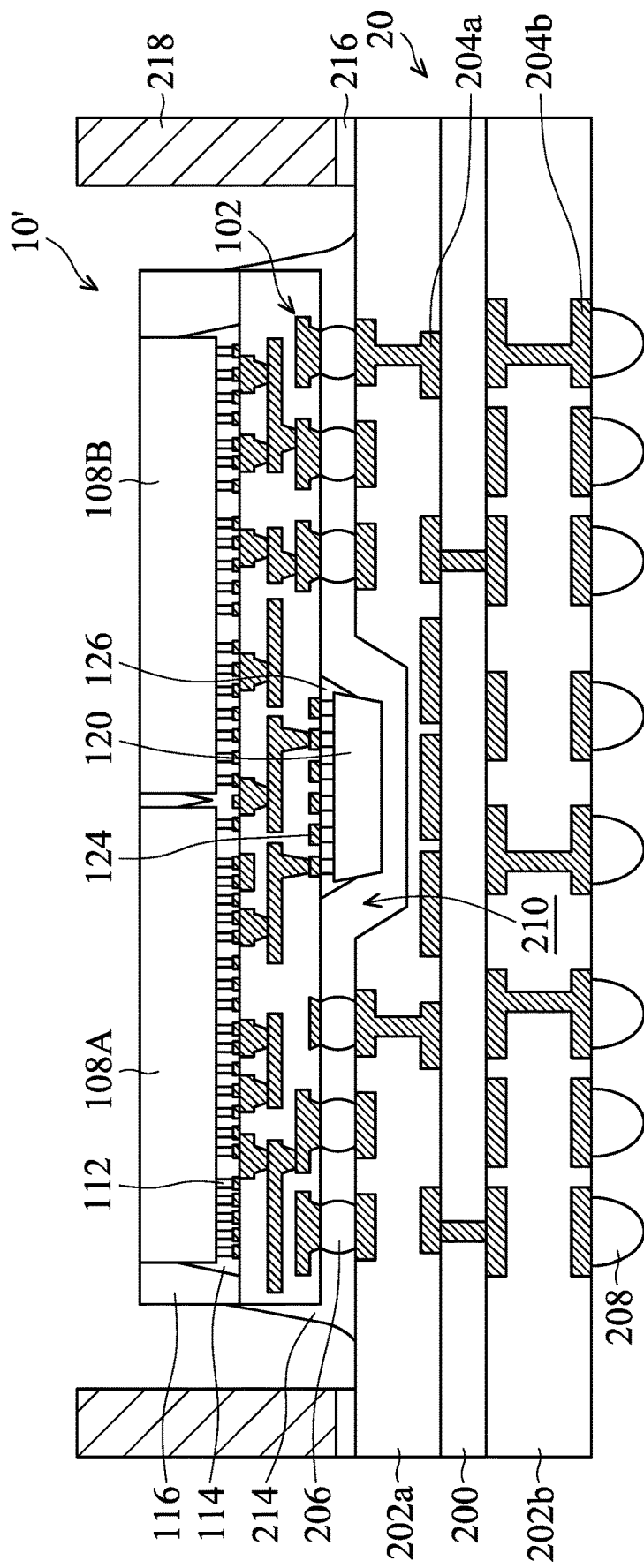

As shown in FIG. 2E, a warpage-control element 218 is disposed over the circuit substrate 20, in accordance with some embodiments. In some embodiments, the warpage-control element 218 is attached to the circuit substrate 20 through an adhesive layer 216. The adhesive layer 216 may be made of an epoxy-based material, one or more other suitable materials, or a combination thereof. The warpage-control element 218 may help to reduce the warpage of the circuit substrate 20 during the subsequent formation processes and/or the reliability testing processes. In some embodiments, the height of the warpage-control element 218 is larger than the height of the die package 10'. In some embodiments, the top surface of the warpage-control element 218 is positioned at a height level that is higher than the top surfaces of the chip structures 108A and 108B.

In some embodiments, the warpage-control element 218 is made of or includes a metal material. The metal material may include aluminum, copper, steel, gold, one or more other suitable materials, or a combination thereof. In some other embodiments, the warpage-control element 218 is made of or includes a semiconductor material, a ceramic material, a polymer material, a metal material, one or more other suitable materials, or a combination thereof. In some embodiments, the warpage-control element 218 has a coefficient of thermal expansion that is similar to that of the circuit substrate 20.

In some embodiments, the warpage-control element 218 is separated from the die package 10' by a distance. In some embodiments, the warpage-control element 218 is separated from the die package 10' without being in direct contact with the die package 10'. In some embodiments, the warpage-control element 218 is separated from the underfill material 214 without being in direct contact with the underfill material 214.

Figure 3:
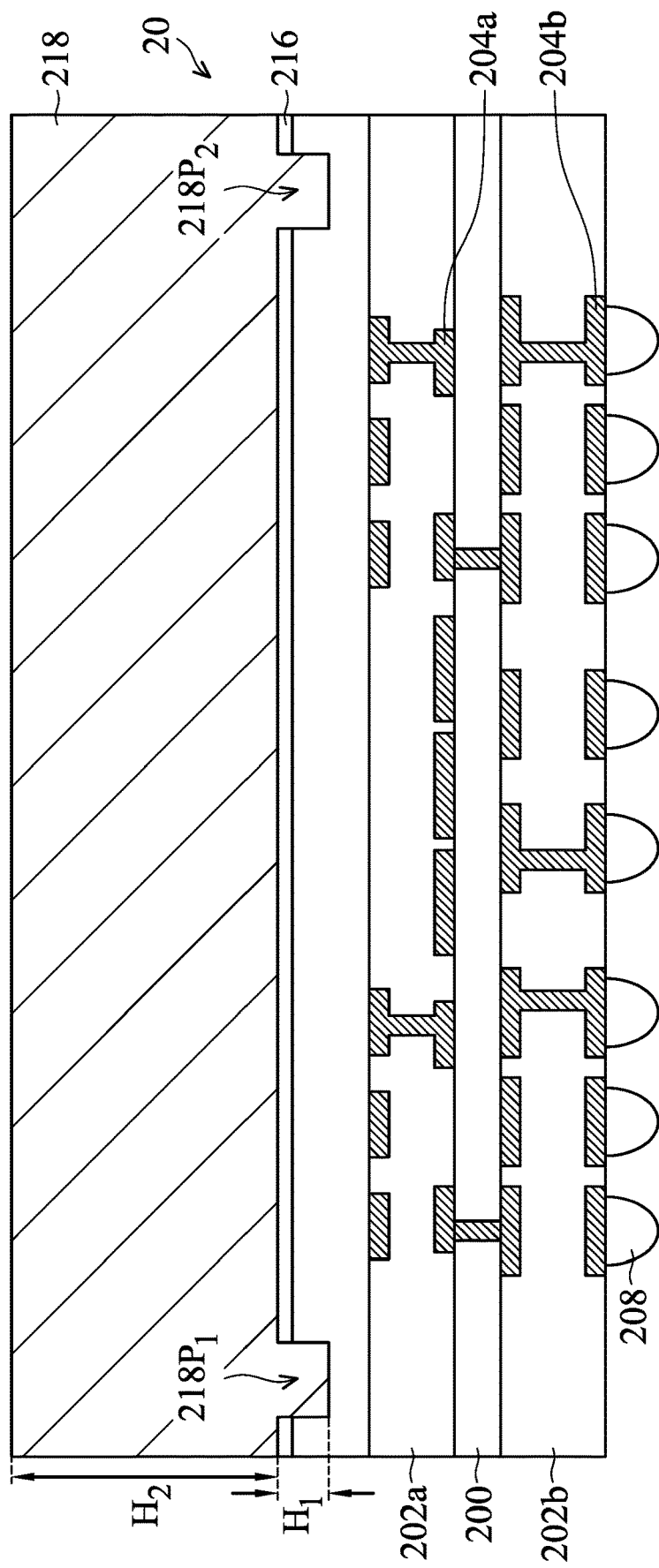
FIG. 3 is a cross-sectional view of a portion of a package structure, in accordance with some embodiments.
Figure 4:
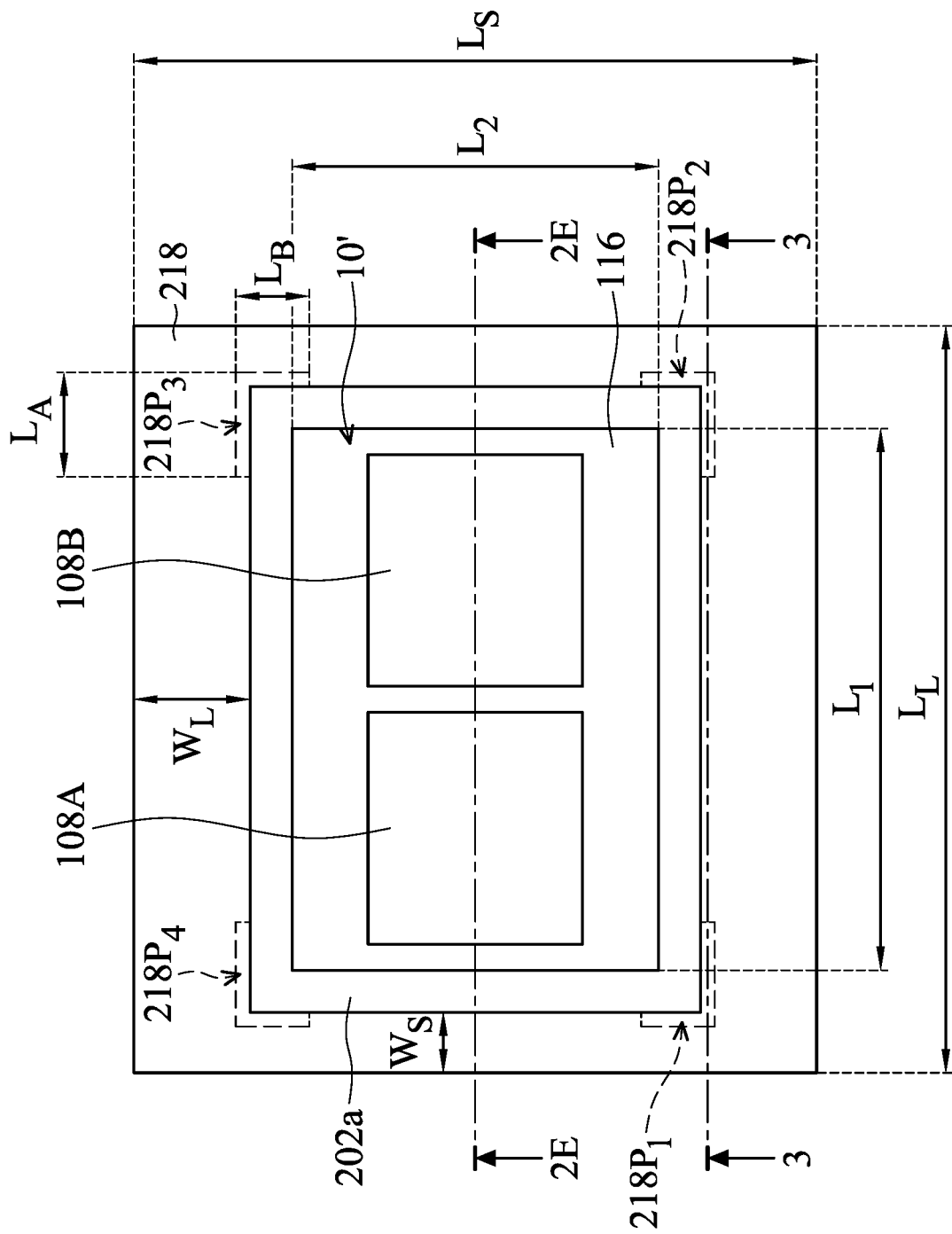
FIG. 4 is a plan view of a portion of a package structure, in accordance with some embodiments.

FIG. 3 is a cross-sectional view of a portion of a package structure, in accordance with some embodiments. FIG. 4 is a plan view of a portion of a package structure, in accordance with some embodiments. In some embodiments, FIG. 4 shows the top plan view of the structure shown in FIGS. 2E and 3. In some embodiments, FIG. 2E shows the cross-sectional view of the package structure taken along the line 2E-2E in FIG. 4. In some embodiments, FIG. 3 shows the cross-sectional view of the package structure taken along the line 3-3 in FIG. 4.

In some embodiments, the warpage-control element 218 includes or is a ring structure, as shown in FIG. 4. The warpage-control element 218 surrounds a region of the circuit substrate 20 where the die package 10' is positioned. The warpage-control element 218 has an opening that exposes the region of the circuit substrate 20. In some embodiments, the warpage-control element 218 continuously surrounds the die package 10', as shown in FIG. 4.

As mentioned above, FIG. 3 shows the cross-sectional view of the package structure taken along the line 3-3 in FIG. 4. In some embodiments, the warpage-control element 218 has protruding portions $218P_1$, $218P_2$, $218P_3$, and $218P_4$ that extend into the circuit substrate 20, as shown in FIG. 3. The protruding portions $218P_1$, $218P_2$, $218P_3$, and $218P_4$ extend towards the bottom surface of the circuit substrate 20. In some embodiments, the circuit substrate 20 is partially removed to form multiple recesses. The warpage-control element 218 is disposed over the circuit substrate 20 so that the protruding portions $218P_1$, $218P_2$, $218P_3$, and $218P_4$ pass through the top surface of the circuit substrate 20 and enter the recesses that are formed in the circuit substrate 20.

In FIG. 4, the protruding portions $218P_1$, $218P_2$, $218P_3$, and $218P_4$ under the main portion of the warpage-control element 218 are illustrated in dashed lines. Because the protruding portions $218P_1$, $218P_2$, $218P_3$, and $218P_4$ extend into the circuit substrate 20, the adhesion between the warpage-control element 218 and the circuit substrate 20 is improved further. The protruding portions $218P_1$, $218P_2$, $218P_3$, and $218P_4$ together with the main portion of the warpage-control element may thus eliminate or reduce the warpage of the circuit substrate 20, so as to further mitigate the warpage of the entire package structure.

In some embodiments, each of the protruding portions $218P_1$, $218P_2$, $218P_3$, and $218P_4$ partially surrounds the respective corner of the region that is surrounded by the warpage-control element 218, as shown in FIG. 4. In some embodiments, four corners of the region are partially surrounded by the protruding portions $218P_1$, $218P_2$, $218P_3$, and $218P_4$, respectively. In some embodiments, each of the protruding portions $218P_1$, $218P_2$, $218P_3$, and $218P_4$ is adjacent to the respective corner of the region surrounded by the warpage-control element 218.

In some embodiments, the protruding portions $218P_1$ to $218P_2$ are designed to be formed only near the corners of the region of the circuit substrate 20 that is surrounded by the warpage-control element 218. Therefore, the space of the circuit substrate 20 is occupied and controlled by the protruding portions $218P_1$ to $218P_2$. There is sufficient space remaining in the circuit substrate 20 for conductive path routing. The warpage degree of the entire package structure is mitigated without seriously impacting the routing route in the circuit substrate 20.

As shown in FIG. 3, the protruding portion $218P_1$ has a height $H_1$, and the main portion of the warpage-control element 218 has a height $H_2$. In some embodiments, the height $H_2$ is greater than the $H_1$. In some other embodiments, the height $H_2$ is substantially equal to the $H_1$. The height $H_1$ may be in a range from about 100 μm to about 1 mm. The height $H_2$ may be in a range from about 1 mm to about 3 mm.

As shown in FIG. 4, the die package 10' has a first side that extends in the first direction (such as the horizontal direction) and a second side that extends in the second direction (such as the vertical direction). The first side has a length $L_1$, and the second side has a length $L_2$. In some embodiments, the first side is longer than the second side. As shown in FIG. 4, each of the protruding portions $218P_1$, $218P_2$, $218P_3$, and $218P_4$ has a first part that extends in the first direction and a second part that extends in the second direction. The first part has a length $L_A$, and the second part has a second length $L_B$, as shown in FIG. 4.

In some embodiments, the lengths $L_A$ and $L_B$ are different from each other, as shown in FIG. 4. In some embodiments, the first part with the length $L_A$ is longer than the second part with the length $L_B$, as shown in FIG. 4. Because the first side of the die package 10' is longer than the second side of the die package 10', the stress on the circuit substrate 20 along the first direction might be relatively high. Since the protruding portions are designed to have the longer first part along the first direction, the warpage of the entire package structure may be mitigated.

As shown in FIG. 4, the warpage-control element 218 has a first portion that extends in the first direction (such as the horizontal direction). The first portion of the warpage-control element 218 has a length $L_L$ and a width $W_L$, as shown in FIG. 4. The warpage-control element 218 has a second portion that extends in the second direction (such as the vertical direction). The second portion of the warpage-control element 218 has a length $L_S$ and a width $W_S$. In some embodiments, the first direction is substantially perpendicular to the second direction. In some embodiments, the length $L_L$ is greater than the length $L_S$. In some embodiments, the width $W_L$ is greater than the width $W_S$.

Because the first side of the die package 10' is longer than the second side of the die package 10', the stress on the circuit substrate 20 along the first direction might be relatively high. The wider first portion of the warpage-control element 218 may have a greater strength to reduce the warpage of the entire package structure.

In the embodiments illustrated in FIG. 4, multiple protruding portions $218P_1$ to $218P_4$ are formed at the corner regions to enhance the adhesion between the circuit substrate 20 and the warpage-control element 218. However, embodiments of the disclosure are not limited thereto. Many variations and/or modifications can be made to embodiments of the disclosure. In some embodiments, the protruding portion of the warpage-control element 218 surrounds the entire region of the circuit substrate 20 that is surrounded by the warpage-control element 218.

Figure 5:
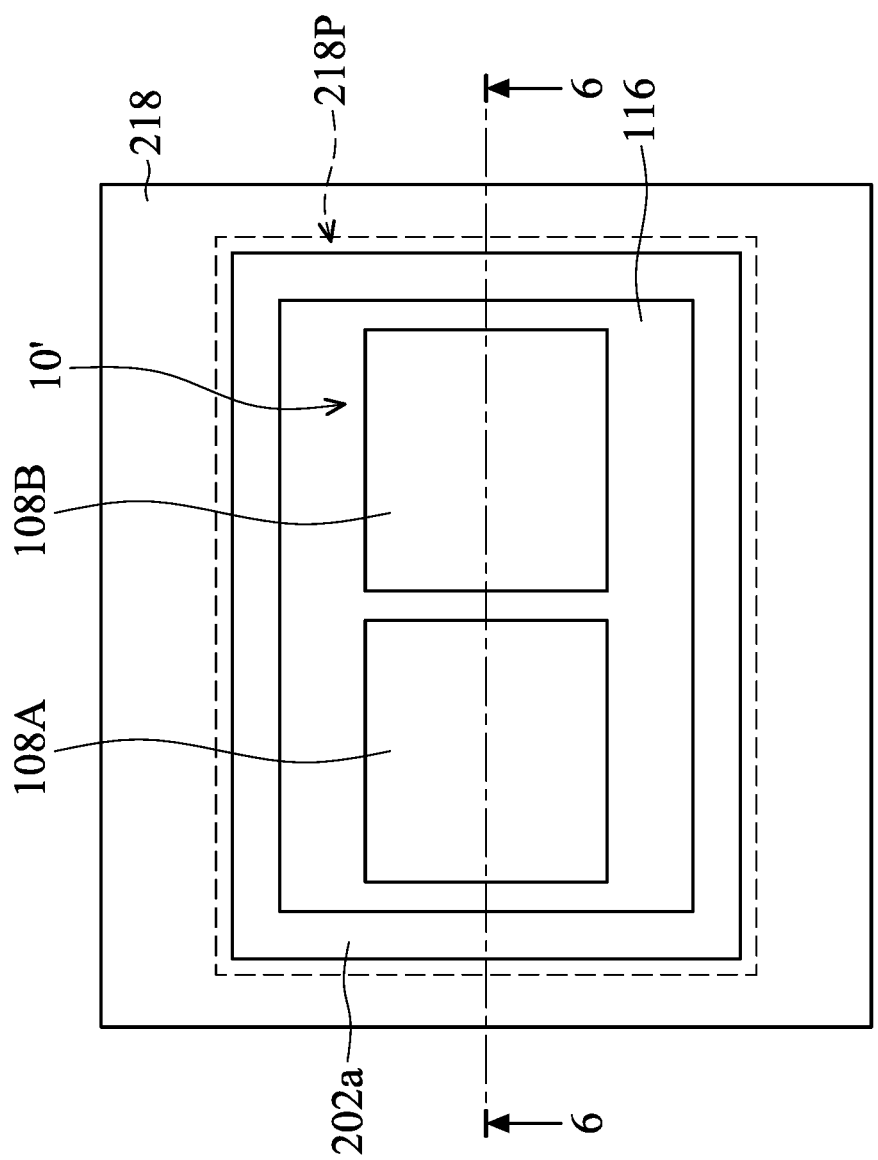
FIG. 5 is a plan view of a portion of a package structure, in accordance with some embodiments.
Figure 6:
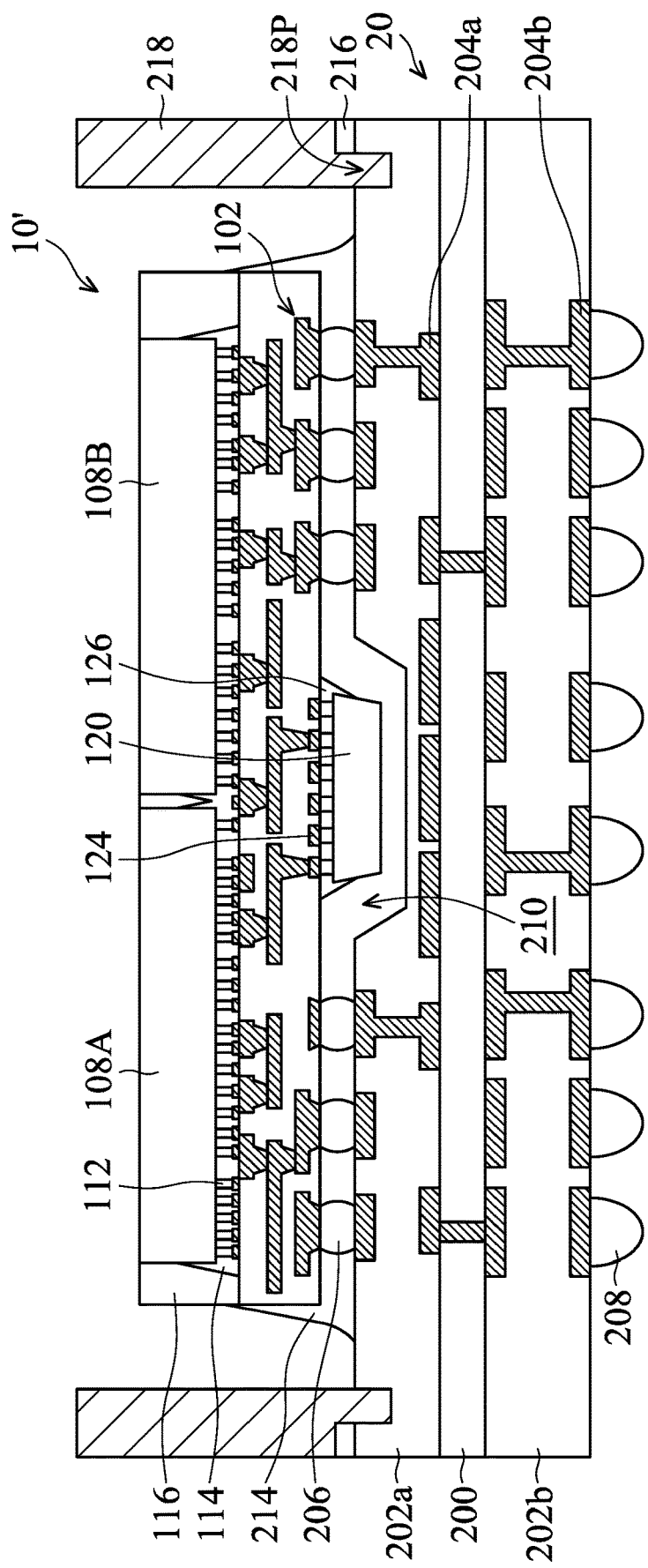
FIG. 6 is a cross-sectional view of a portion of a package structure, in accordance with some embodiments.

FIG. 5 is a plan view of a portion of a package structure, in accordance with some embodiments. FIG. 6 is a cross-sectional view of a portion of a package structure, in accordance with some embodiments. In some embodiments, FIG. 6 shows the cross-sectional view of the package structure taken along the line 6-6 in FIG. 5. In some embodiments, the warpage-control element 218 has a protruding portion 218P that extends into the circuit substrate 20, as shown in FIG. 6. In some embodiments, the protruding portion 218P includes a ring structure, as shown in FIG. 5. In some embodiments, the protruding portion 218P surrounds the region of the circuit substrate 20 that is surrounded by the warpage-control element 218, as shown in FIG. 5. In some embodiments, the protruding portion 218P continuously surrounds the region of the circuit substrate 20 that is surrounded by the warpage-control element 218, as shown in FIG. 5.

Figure 7:
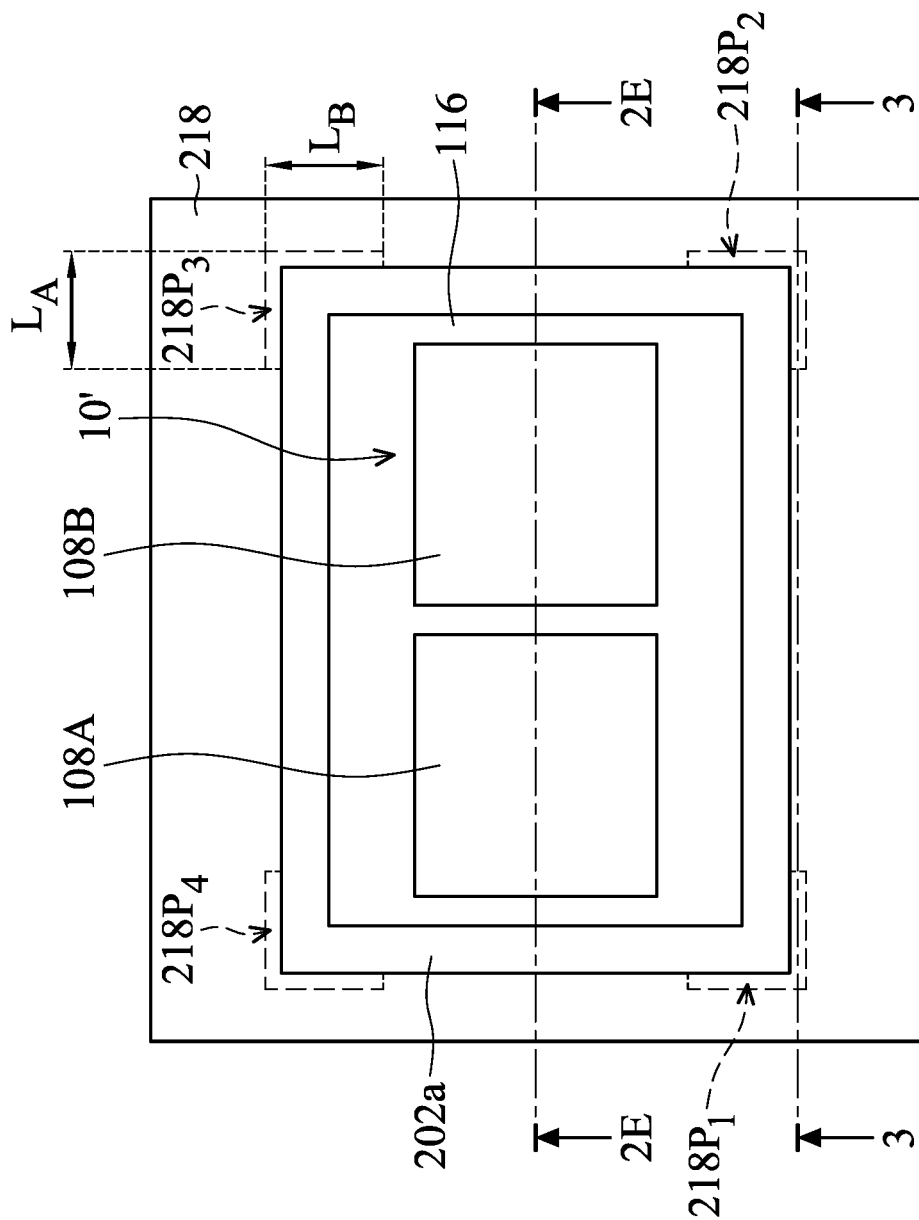
FIG. 7 is a plan view of a portion of a package structure, in accordance with some embodiments.

Many variations and/or modifications can be made to embodiments of the disclosure. FIG. 7 is a plan view of a portion of a package structure, in accordance with some embodiments. As shown in FIG. 7, the die package 10' has a first side that extends in the first direction (such as the horizontal direction) and a second side that extends in the second direction (such as the vertical direction). In some embodiments, the first side is longer than the second side. As shown in FIG. 7, each of the protruding portions $218P_1$, $218P_2$, $218P_3$, and $218P_4$ has a first part that extends in the first direction and a second part that extends in the second direction. The first part has a length $L_A$, and the second part has a second length $L_B$, as shown in FIG. 7. In some embodiments, the first part with the length $L_A$ is substantially as long as the second part with the length $L_B$, as shown in FIG. 7.

Figure 8:
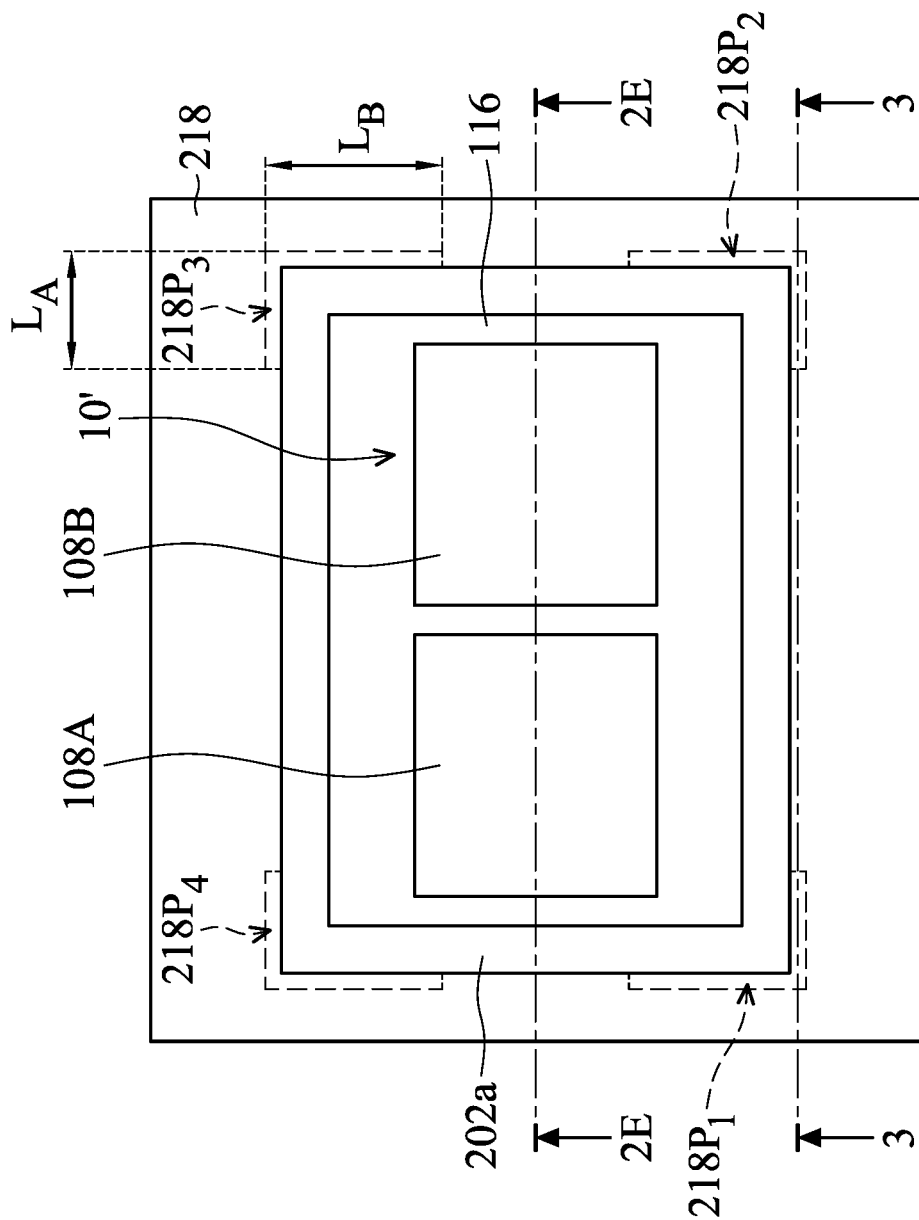
FIG. 8 is a plan view of a portion of a package structure, in accordance with some embodiments.

Many variations and/or modifications can be made to embodiments of the disclosure. FIG. 8 is a plan view of a portion of a package structure, in accordance with some embodiments. As shown in FIG. 8, the die package 10' has a first side that extends in the first direction (such as the horizontal direction) and a second side that extends in the second direction (such as the vertical direction). In some embodiments, the first side is longer than the second side. As shown in FIG. 8, each of the protruding portions $218P_1$, $218P_2$, $218P_3$, and $218P_4$ has a first part that extends in the first direction and a second part that extends in the second direction. The first part has a length $L_A$, and the second part has a second length $L_B$, as shown in FIG. 8. In some embodiments, the lengths $L_A$ and $L_B$ are different from each other, as shown in FIG. 8. In some embodiments, the first part with the length $L_A$ is longer than the second part with the length $L_B$, as shown in FIG. 8.

In the embodiments illustrated in FIG. 4, each of the protruding portions $218P_1$ to $218P_4$ is adjacent to the respective corner of the region of the circuit substrate 20 that is surrounded by the warpage-control element 218. However, embodiments of the disclosure are not limited thereto. Many variations and/or modifications can be made to embodiments of the disclosure. In some other embodiments, one or some of the protruding portions is/are not adjacent to the respective corner of the region of the circuit substrate 20 that is surrounded by the warpage-control element 218.

Figure 9:
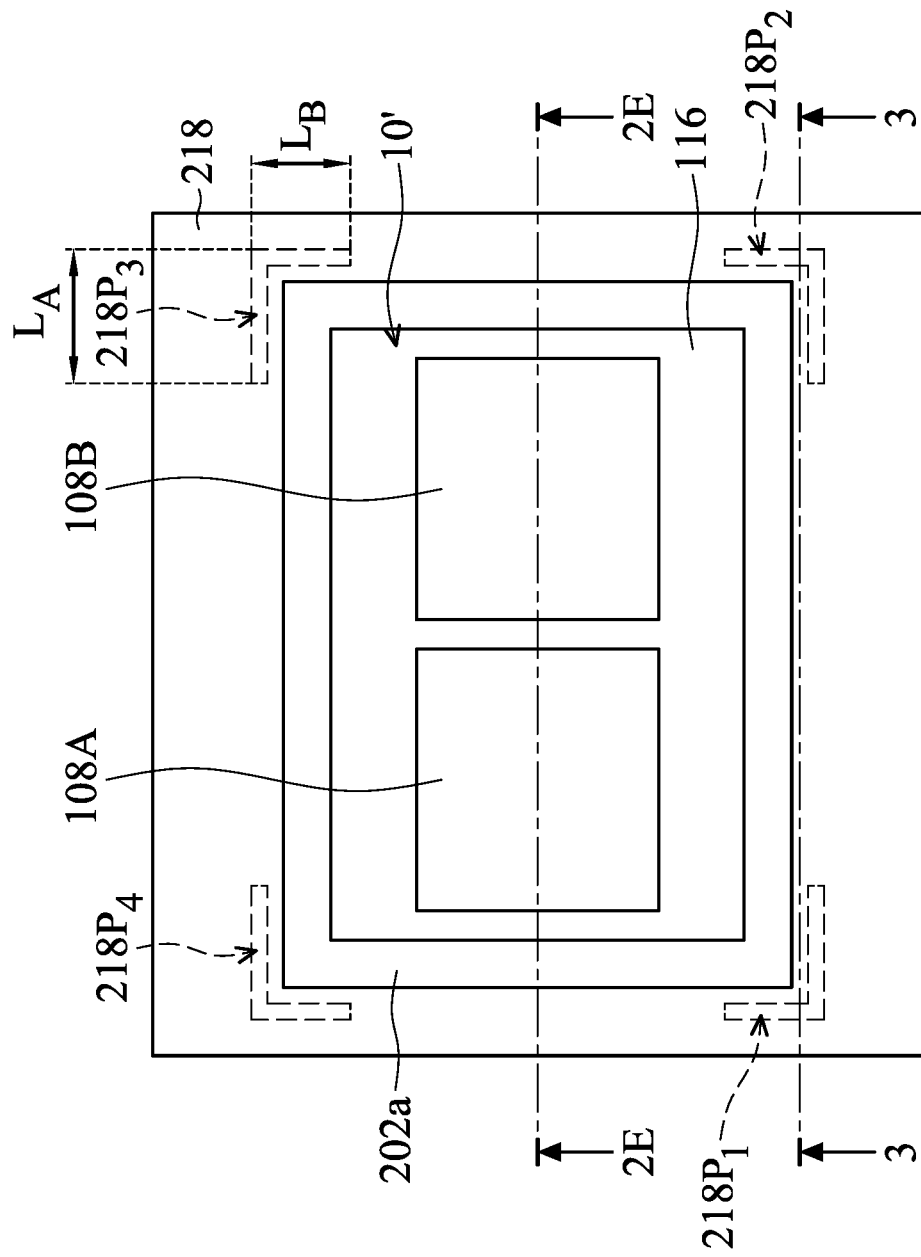
FIG. 9 is a plan view of a portion of a package structure, in accordance with some embodiments.

FIG. 9 is a plan view of a portion of a package structure, in accordance with some embodiments. In some embodiments, each of the protruding portions $218P_1$ to $218P_4$ is not adjacent to the respective corner of the region of the circuit substrate 20 that is surrounded by the warpage-control element 218. In some embodiments, each of the protruding portions $218P_1$ to $218P_4$ partially surrounds the respective corner of the region, as shown in FIG. 9. Each of the protruding portions $218P_1$ to $218P_4$ is separated from the respective corner that is partially surrounded.

Figure 10:
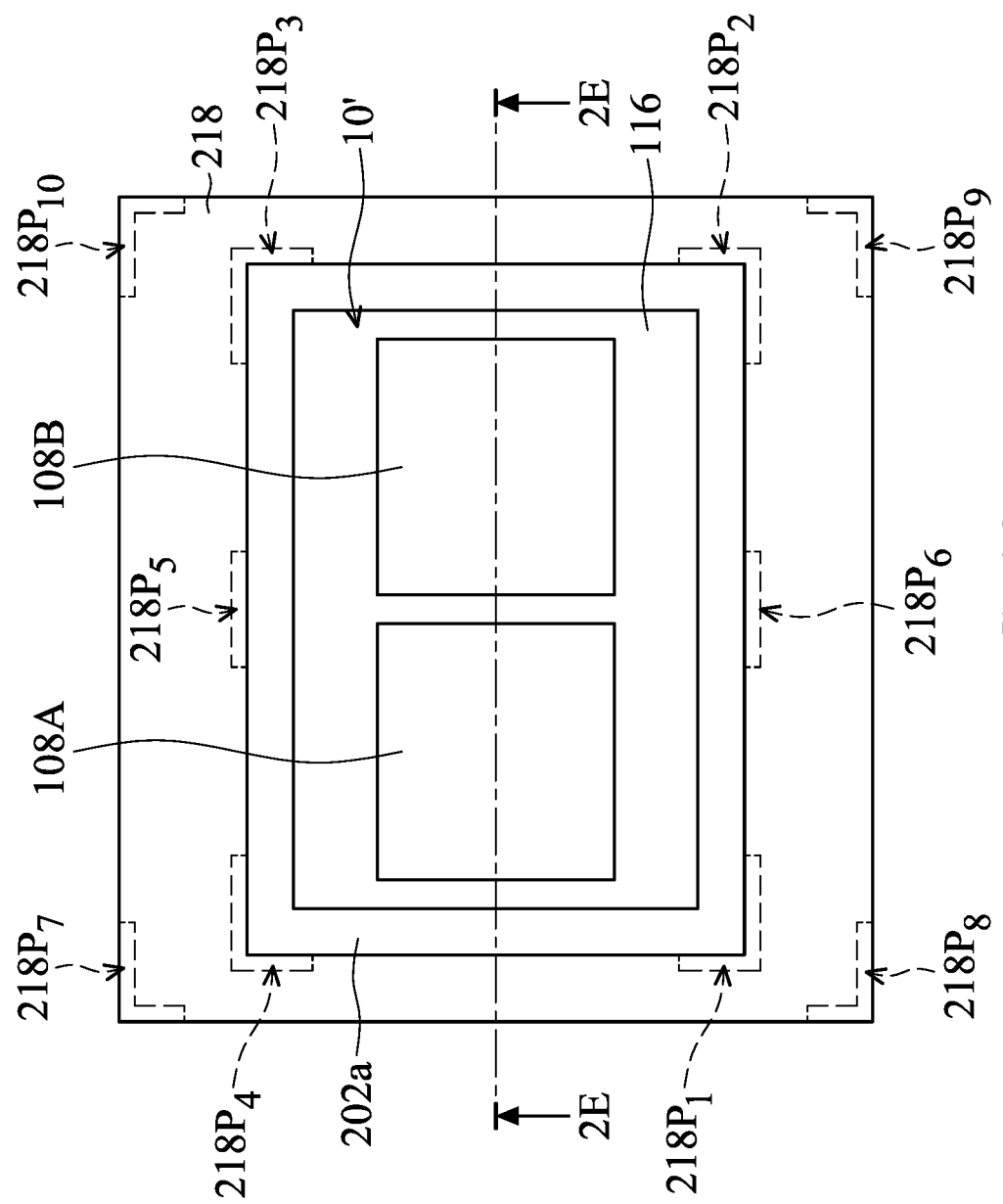
FIG. 10 is a plan view of a portion of a package structure, in accordance with some embodiments.

Many variations and/or modifications can be made to embodiments of the disclosure. FIG. 10 is a plan view of a portion of a package structure, in accordance with some embodiments. Similar to the embodiments illustrated in FIG. 4, the warpage-control element 218 has the protruding portions $218P_1$ to $218P_4$ that partially surround the corners of the region that is surrounded by the warpage-control element 218. In some embodiments, the warpage-control element 218 further includes protruding portions $218P_5$ and $218P_6$. Similar to the protruding portions $218P_1$ to $218P_2$, the protruding portions $218P_5$ and $218P_6$ also extend into the circuit substrate 20. In some embodiments, each of the protruding portions $218P_5$ and $218P_6$ laterally extends across a gap between the chip structures 108A and 108B. Each of the protruding portions $218P_5$ and $218P_6$ laterally extends across opposite sides of the chip structures 108A and 108B.

In some embodiments, the warpage-control element 218 further includes protruding portions $218P_7$, $218P_8$, $218P_9$, and $218P_{10}$. Similar to the protruding portions $218P_1$ to $218P_2$, the protruding portions $218P_7$ to $218P_{10}$ also extend into the circuit substrate 20, as shown in FIG. 10. In some embodiments, each of the protruding portions $218P_7$ to $218P_{10}$ is positioned at the respective corner of the warpage-control element 218.

Figure 11:
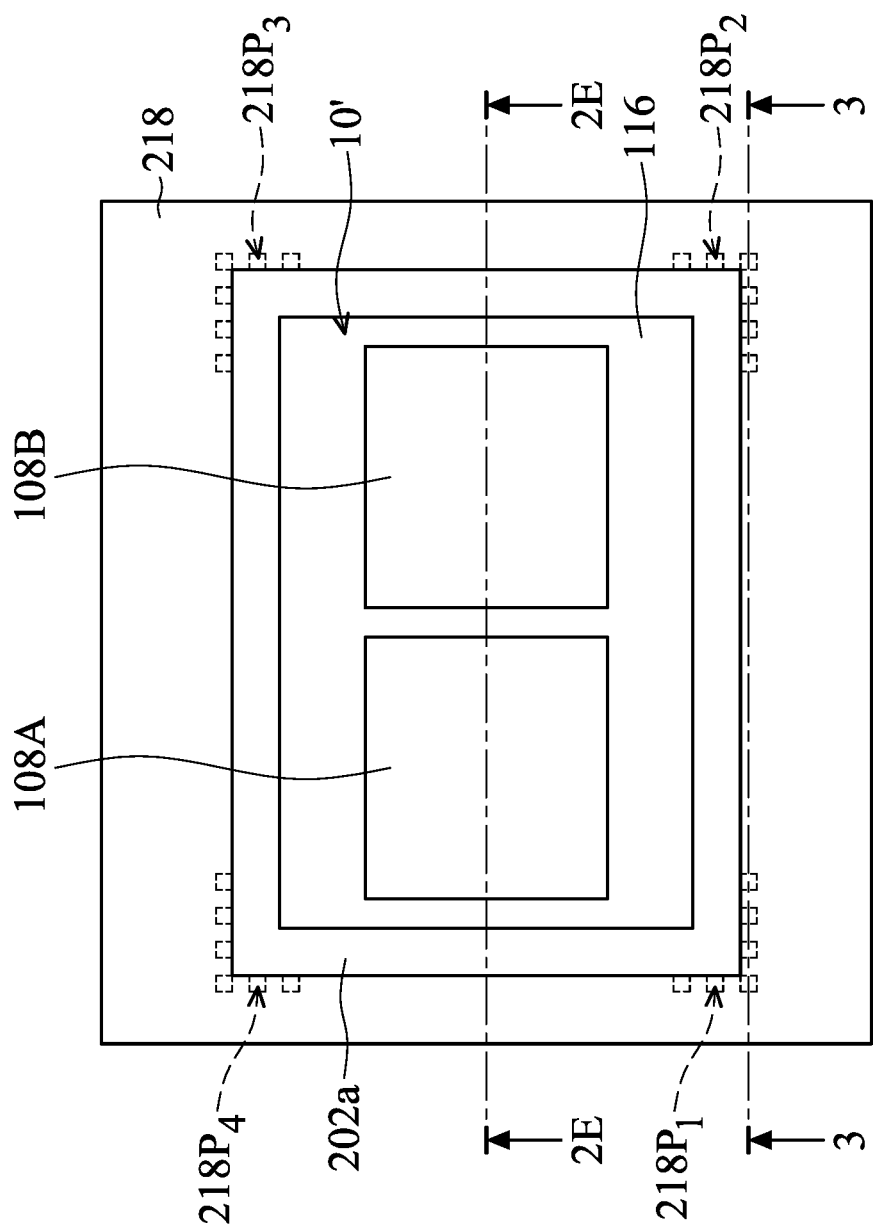
FIG. 11 is a plan view of a portion of a package structure, in accordance with some embodiments.

Many variations and/or modifications can be made to embodiments of the disclosure. FIG. 11 is a plan view of a portion of a package structure, in accordance with some embodiments. In some embodiments, each of the protruding portions $218P_1$ to $218P_4$ includes multiple protruding elements that extend into the circuit substrate 20. In some embodiments, these protruding elements are separated from each other by portions of the circuit substrate 20.

In some embodiments, the protruding elements of the protruding portion $218P_1$ together partially surround a corner of the region that is surrounded by the warpage-control element 218. Similarly, the protruding elements of each of the protruding portions $218P_2$ to $218P_4$ partially surround the respective corner of the region of the circuit substrate 20 surrounded by the warpage-control element 218.

In some embodiments, each of the protruding elements of the protruding portions $218P_1$ to $218P_4$ has a square or square-like top view profile. However, embodiments of the disclosure are not limited thereto. Many variations and/or modifications can be made to embodiments of the disclosure. In some other embodiments, each of the protruding elements of the protruding portions $218P_1$ to $218P_4$ has a rectangular top view profile, a rectangle-like top view profile, a circular top view profile, a circle-like top view profile, an oval top view profile, or an oval-like top view profile. In some other embodiments, some of the protruding elements have top view profiles that are different than those of other protruding elements.

Figure 12:
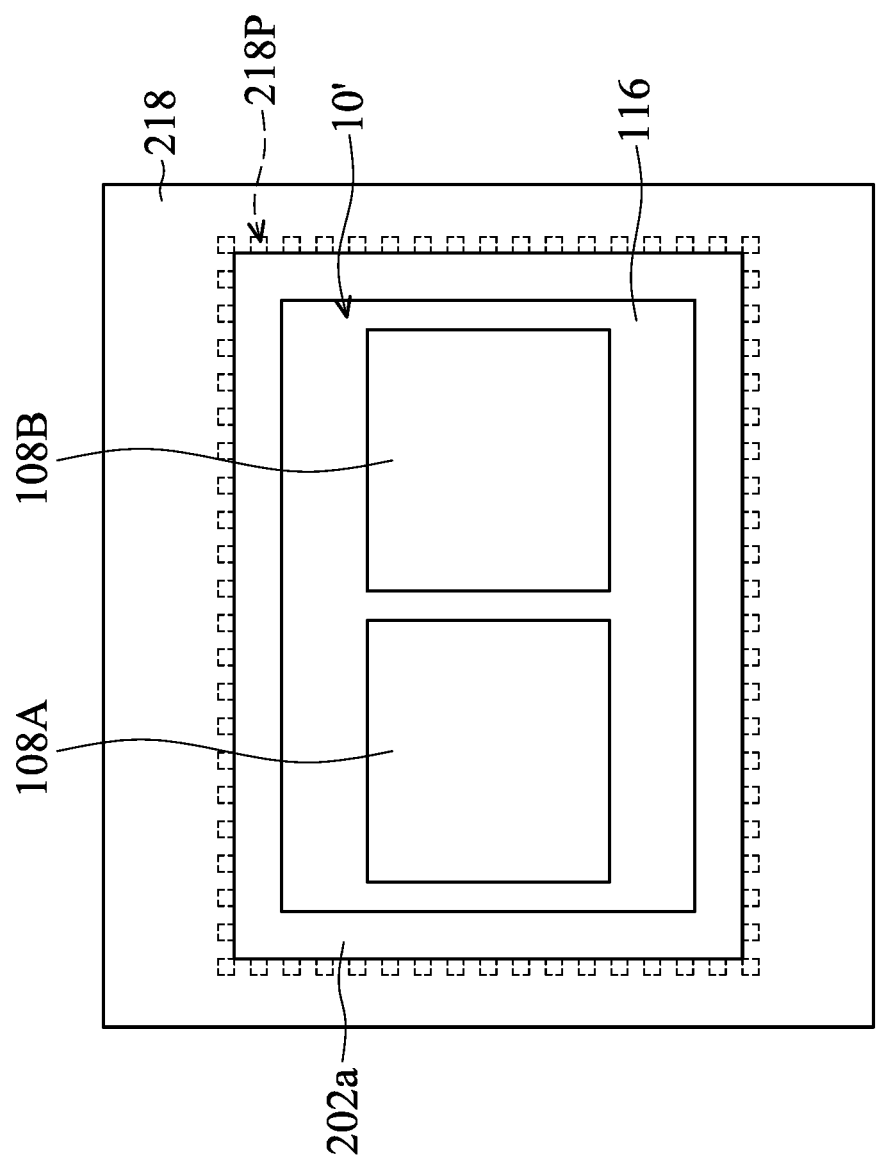
FIG. 12 is a plan view of a portion of a package structure, in accordance with some embodiments.

Many variations and/or modifications can be made to embodiments of the disclosure. FIG. 12 is a plan view of a portion of a package structure, in accordance with some embodiments. In some embodiments, the protruding portion 218P includes multiple protruding elements that extend into the circuit substrate 20. In some embodiments, the protruding elements of the protruding portion 218P together surround the region of the circuit substrate 20 surrounded by the warpage-control element 218.

Figure 13:
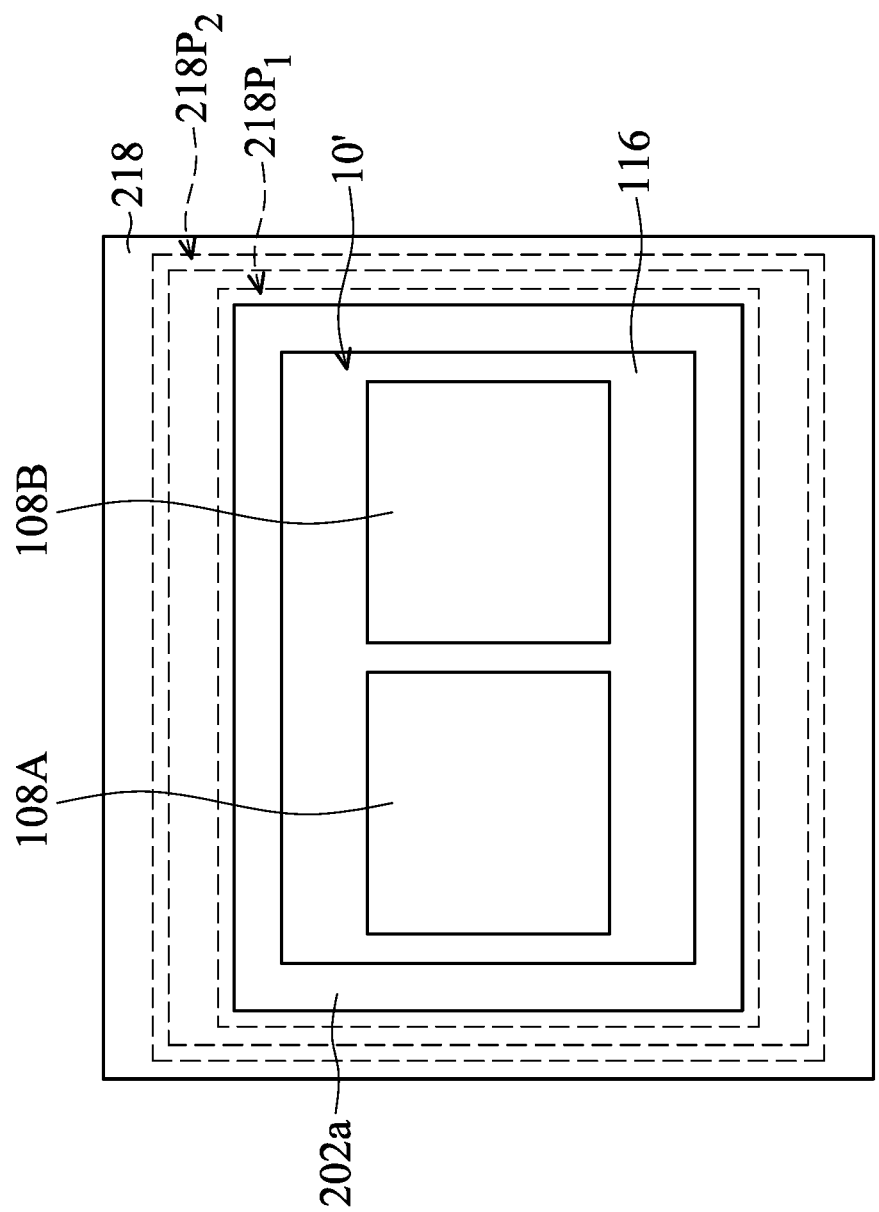
FIG. 13 is a plan view of a portion of a package structure, in accordance with some embodiments.

Many variations and/or modifications can be made to embodiments of the disclosure. FIG. 13 is a plan view of a portion of a package structure, in accordance with some embodiments. Similar to the embodiments illustrated in FIG. 5, the warpage-control element 218 includes a protruding portion $218P_1$ that surrounds the region of the circuit substrate 20 surrounded by the warpage-control element 218. In some embodiments, the warpage-control element 218 further includes a protruding portion $218P_2$, as shown in FIG. 13. In some embodiments, the protruding portion $218P_2$ extends into the circuit substrate 20. In some embodiments, the protruding portion $218P_2$ is a ring structure. In some embodiments, the protruding portion $218P_2$ surrounds the protruding portion $218P_1$. In some embodiments, the protruding portion $218P_2$ also surrounds the region of the circuit substrate 20 surrounded by the warpage-control element 218.

Figure 14:
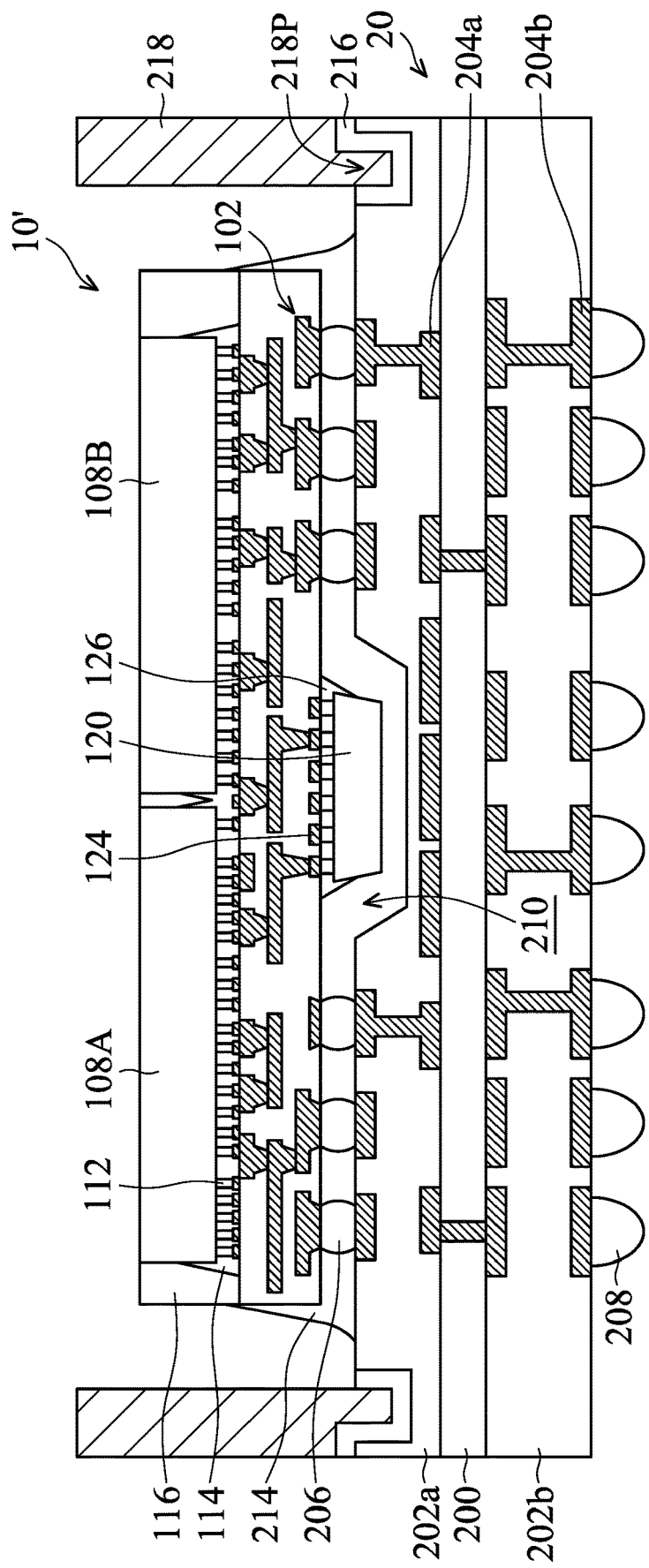
FIG. 14 is a cross-sectional view of a portion of a package structure, in accordance with some embodiments.

In some embodiments illustrated in FIGS. 3 and 6, the protruding portions of the warpage-control element 218 are in direct contact with the circuit substrate 20. However, embodiments of the disclosure are not limited thereto. Many variations and/or modifications can be made to embodiments of the disclosure. FIG. 14 is a cross-sectional view of a portion of a package structure, in accordance with some embodiments. In some embodiments, the adhesive layer 216 extends into the recesses of the circuit substrate 20 before the warpage-control element 218 is disposed over the circuit substrate 20. For example, a glue used for forming the adhesive layer 216 may flow into the recesses formed in the circuit substrate 20 before the warpage-control element 218 is disposed over the circuit substrate 20. After the warpage-control element 218 is attached to the circuit substrate 20, the protruding portion 218P of the warpage-control element 218 is in direct contact with the adhesive layer 216 without being in direct contact with the circuit substrate 20.

Embodiments of the disclosure form a package structure with a warpage-control element that is used to control the warpage of a circuit substrate that carries one or more die packages. The warpage-control element includes one or more protruding portions that extend into the circuit substrate. Because the protruding portions extend into the circuit substrate, the adhesion between the warpage-control element and the circuit substrate is improved further. The protruding portions together with the main portion of the warpage-control element may thus together eliminate or reduce the warpage of the circuit substrate, so as to further mitigate the warpage of the entire package structure. The warpage-control element has portions other than the protruding portions that do not extend into the circuit substrate. Therefore, there is sufficient space remaining in the circuit substrate for conductive path routing. The reliability and the quality of the package structure are greatly improved.

In accordance with some embodiments, a package structure is provided. The package structure includes a circuit substrate and a die package bonded to the circuit substrate through bonding structures. The package structure also includes a warpage-control element attached to the circuit substrate. The warpage-control element has a protruding portion extending into the circuit substrate. The warpage-control element has a height larger than that of the die package.

In accordance with some embodiments, a package structure is provided. The package structure includes a circuit substrate and a chip structure over the circuit substrate. The package structure also includes a warpage-control element penetrating into the circuit substrate. The warpage-control element has a protruding portion extending towards a bottom surface of the circuit substrate. A top surface of the warpage-control element is positioned at a height level higher than a top surface of the chip structure.

In accordance with some embodiments, a method for forming a package structure is provided. The method includes disposing a die package over a circuit substrate. The method also includes disposing a warpage-control element over the circuit substrate so that a protruding portion of the warpage-control element passes through a top surface of the circuit substrate. The protruding portion partially surrounds a corner of the die package.

Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a circuit substrate;
a die package bonded to the circuit substrate through bonding structures; and
a warpage-control element attached to the circuit substrate, wherein the warpage-control element has a protruding portion extending into the circuit substrate, and the warpage-control element has a height larger than that of the die package.

2. The package structure as claimed in claim 1, wherein the warpage-control element comprises a ring structure surrounding a region of the circuit substrate, and the die package is positioned over the region.

3. The package structure as claimed in claim 2, wherein the protruding portion partially surrounds a corner of the region surrounded by the ring structure.

4. The package structure as claimed in claim 3, wherein the die package has a first side extending in a first direction, the die package has a second side extending in a second direction, the first side is longer than the second side, the protruding portion has a first part extending in the first direction, the protruding portion has a second part extending in the second direction, and the first part and the second part have different lengths.

5. The package structure as claimed in claim 4, wherein the first part is longer than the second part.

6. The package structure as claimed in claim 3, wherein the protruding portion is adjacent to the corner of the region surrounded by the ring structure.

7. The package structure as claimed in claim 2, wherein the protruding portion comprises a plurality of protruding elements extending into the circuit substrate, and the protruding elements together partially surround a corner of the region surrounded by the ring structure.

8. The package structure as claimed in claim 2, wherein the warpage-control element has a second protruding portion extending into the circuit substrate, and the second protruding portion partially surrounds a second corner of the region surrounded by the ring structure.

9. The package structure as claimed in claim 2, wherein the protruding portion comprises a plurality of protruding elements extending into the circuit substrate, and the protruding elements together surround the region of the circuit substrate surrounded by the ring structure.

10. The package structure as claimed in claim 2, wherein the die package has a first side extending in a first direction, the die package has a second side extending in a second direction, the first side is longer than the second side, the ring structure has a first portion extending in the first direction, the ring structure has a second portion extending in the second direction, and the first portion of the ring structure is wider than the second portion of the ring structure.

11. The package structure as claimed in claim 1, wherein the protruding portion of the warpage-control element comprises a ring structure surrounding a region of the circuit substrate, and the die package is positioned over the region.

12. A package structure, comprising:
a circuit substrate;
a chip structure over the circuit substrate; and
a warpage-control element penetrating into the circuit substrate, wherein the warpage-control element has a protruding portion extending towards a bottom surface of the circuit substrate, and a top surface of the warpage-control element is positioned at a height level higher than a top surface of the chip structure.

13. The package structure as claimed in claim 12, wherein the warpage-control element has a second protruding portion extending through a top surface of the circuit substrate.

14. The package structure as claimed in claim 12, wherein the protruding portion continuously surrounds the chip structure.

15. The package structure as claimed in claim 12, wherein the warpage-control element surrounds a region of the circuit substrate where the chip structure is positioned, and the protruding portion partially surrounds a corner of the region surrounded by the warpage-control element.

16. A method for forming a package structure, comprising:
- disposing a die package over a circuit substrate; and
- disposing a warpage-control element over the circuit substrate so that a protruding portion of the warpage-control element passes through a top surface of the circuit substrate, wherein the protruding portion partially surrounds a corner of the die package.

17. The method for forming a package structure as claimed in claim 16, further comprising:
- forming an adhesive layer over the circuit substrate; and
- attaching the warpage-control element to the circuit substrate through the adhesive layer.

18. The method for forming a package structure as claimed in claim 16, wherein the warpage-control element has an opening exposing the die package.

19. The method for forming a package structure as claimed in claim 16, further comprising:
- forming an underfill material over the circuit substrate, wherein a portion of the underfill material is between the die package and the circuit substrate;
- heating the underfill material; and
- disposing the warpage-control element over the circuit substrate after the underfill material is heated.

20. The method for forming a package structure as claimed in claim 16, wherein the protruding portion of the warpage-control element is positioned to be in direct contact with the circuit substrate.

* * * * *